United States Patent [19]

Reid et al.

[11] Patent Number: 4,869,636
[45] Date of Patent: Sep. 26, 1989

[54] HANDLER FOR IC PACKAGES

[75] Inventors: Steven J. Reid, Los Gatos; Lewis R. Weiss, Scotts Valley; Bryan R. Riley, San Jose, all of Calif.

[73] Assignee: Reid-Ashman Manufacturing, Inc., San Jose, Calif.

[21] Appl. No.: 66,080

[22] Filed: Jun. 24, 1987

[51] Int. Cl.[4] .................. B65G 47/24; H05K 13/02
[52] U.S. Cl. ................................ 414/331; 414/287; 414/222
[58] Field of Search ............ 414/331, 222, 225, 332, 414/416, 737, 783, 287; 73/41, 45

[56] References Cited

U.S. PATENT DOCUMENTS

| | | | |
|---|---|---|---|
| 3,308,977 | 3/1967 | Cochran et al. | 414/222 |
| 3,613,904 | 10/1971 | Blatt | 414/737 |
| 3,977,566 | 8/1976 | Hill et al. | 414/331 X |
| 4,712,675 | 12/1987 | Scholten et al. | 206/332 |
| 4,725,182 | 2/1988 | Sakamoto et al. | 414/331 |
| 4,736,841 | 4/1988 | Kaneko et al. | 206/332 |
| 4,759,681 | 7/1988 | Nogami | 414/331 X |

FOREIGN PATENT DOCUMENTS 0258459 12/1985 Japan .................. 414/287

OTHER PUBLICATIONS

SMD Handler Brochure, Mobius Technology, Inc., 2 pages.

*Primary Examiner*—Frank E. Werner
*Assistant Examiner*—Robert S. Katz
*Attorney, Agent, or Firm*—Joseph H. Smith

[57] ABSTRACT

A package handling apparatus for presenting circuit packages to a test head is provided which uses a soft handling approach throughout the system. The handler works with a plurality of sticks, with each stick adapted for holding a plurality of packages in a substantially horizontal linear array, with the linear array defining a linear axis for the stick. The handler includes an input elevator element for receiving a first stick loaded with a first package, for moving the first stick vertically to an index level. An input drive moves the first stick horizontally to an index position. A first pick-up removes the first package from the first stick and then moves the first package to a stage pick-up position. A stage element receives the first package, and presents it to the test head for testing. Once tested, the stage element moves the package to a stage exit position. A stage pick-up then places the first package in a stage row stick. A third pick-up then removes the first package from the stage row stick, and places it into a storage row stick in response to a signal from the test head. With this approach, packages are transported and stored in sticks, except when on the stage element. Hence, the packages never contact each other or feed trays. Furthermore, gravity is not used for stick transport. Instead, controlled drive systems are used. Hence, the entire system can be configured to avoid problematic accelerations, and hence reduce potential damage to the delicate integrated circuits being transported.

18 Claims, 23 Drawing Sheets

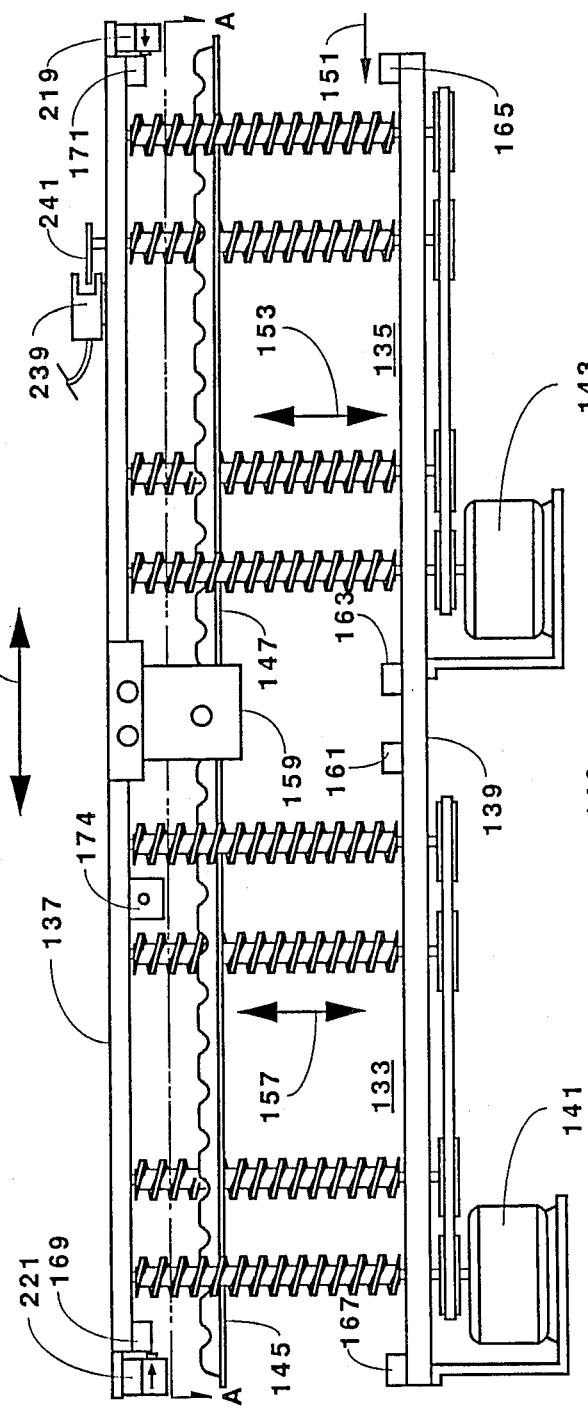
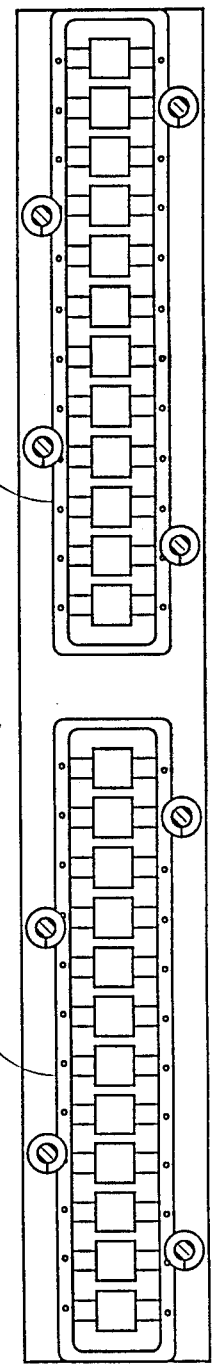
FIG. 7 A
FIG. 7 B

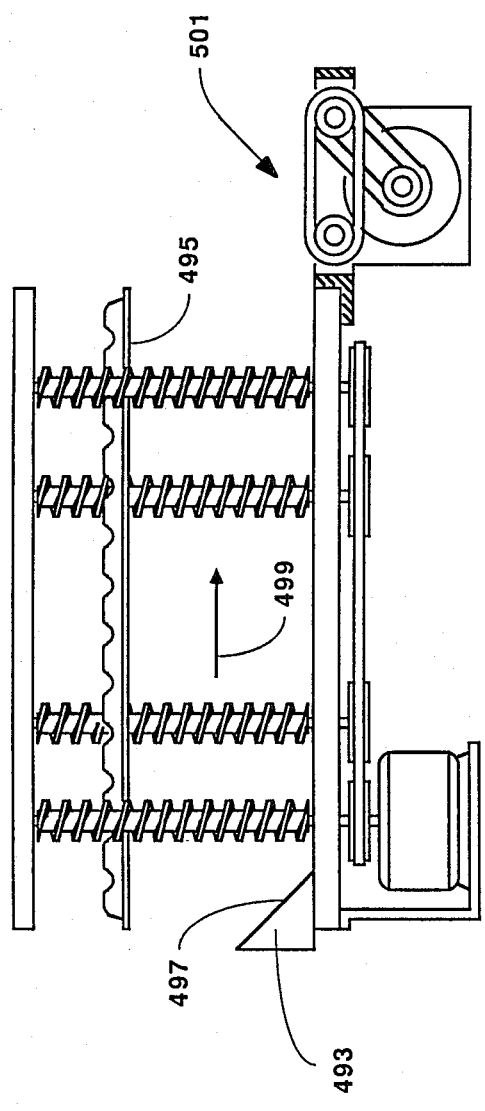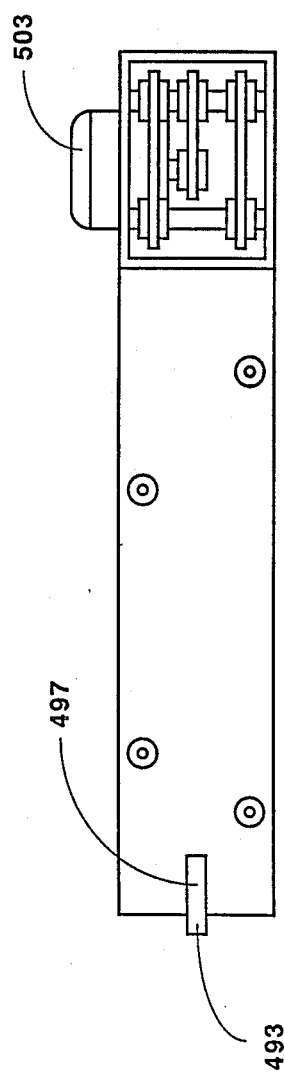
FIG. 20 A
FIG. 20 B

HANDLER FOR IC PACKAGES

BACKGROUND OF THE INVENTION

This invention is related to package handlers for integrated circuit packages, and particularly to an apparatus for soft handling of such packages.

As the art and science of electronics and integrated circuits has progressed, the demands made of packaging systems and handlers for presenting such systems to testing equipment has seen increasing complexity. As the packages for integrated circuits have advanced from the simple dual-in-line type to various kinds of chip carriers with high pin counts, the package sizes have increased considerably and in many cases the integrated circuits that they hold have become increasingly susceptible to vibration damage. Also, the package handling arts have not kept pace with these advances in package design. For example, a significant number of chip carrier designs are presently constructed of relatively fragile ceramic materials. Yet, most package handlers for such packages make no provision for soft handling of such fragile materials. Most handlers at the present time tend to use the force of gravity and a system of immovable metallic or hard plastic troughs to feed packages destined for test throughout the test apparatus, thereby permitting the packages to bump into one another in the troughs, and potentially causing damage to the sensitive electronic components therein. Some manufacturers have at least recognized the problem and have provided a plastic "bumper" which can be placed on each package, so that when they impact each other in the handling equipment, that impact is largely absorbed by the bumper. Such solutions are however, far less than satisfactory in that the bumpers are time consuming to install if they are not made directly with the package. Furthermore, such solutions do not recognize the inherent weakness of simply lessening the impact that occurs between components in the handling system.

What is needed is a package handling system that avoids impact between packages completely, while at the same time providing a convenient approach to feeding packages into the system and removing them therefrom.

SUMMARY OF THE INVENTION

In accordance with preferred embodiments of the invention, a package handling apparatus for presenting circuit packages to a test head is provided which uses a soft handling approach throughout the system. The handler works in conjunction with a plurality of carrier platens, called sticks, with each stick adapted for holding a plurality of packages in a substantially horizontal linear array, with the linear array defining a linear axis for the stick. The handler includes an input elevator element for receiving a first stick loaded with a first package, with the linear axis of the first stick oriented in a first direction, for moving the first stick vertically to an index level with the linear axis oriented in a direction parallel to the first direction. The system includes an input drive for moving the first stick horizontally in a direction parallel to the first direction at the index level to an index position where the first package can be removed from the first stick, and for moving the first stick away from the index position after the package has been removed. A first pick-up removes the first package from the first stick when the first stick is located at the index position and moves the first package to a stage pick-up position. A stage element receives the first package when the first pick-up moves the first package to the stage pick-up position, and presents the first package to the test head for testing. Once tested, the stage element moves the package to a stage exit position for pick-up by a stage pick-up. The stage pick-up then places the first package in a stage row stick at a stage row receiving level. A third pick-up then removes the first package from the stage row stick, and places it into a storage row stick located at a storage row receiving level in response to a signal from the test head.

In a preferred embodiment, the third pick-up includes a translation element for placing the first package into one of a plurality of storage row sticks located at a storage row receiving level in response to a signal from the test head that is correllated with results of tests performed by the test head on the package. Also included is a plurality of storage elevator elements for holding a plurality of storage row sticks and for moving the plurality of storage row sticks to a vertical level different than the storage row receiving level for storage.

In the preferred mode, the sticks typically have two parallel sides spaced apart horizontally that are oriented in a direction parallel to the linear axis of the stick. The input elevator element is also adapted to hold a plurality of sticks identical to the first stick, and includes a system of at least four augers spaced apart to engage the periphery of the sticks, with two of the augers on each of the parallel sides, the augers configured for moving the sticks vertically to the index level as they are turned. As a stick is brought to the index level, the input drive then moves it to a succession of index positions corresponding to each of the pick-up positions for the packages in the stick. The system also includes a drive system that works in conjunction with the storage elevator for similarly indexing the output side of the system.

Using the above approach, the packages are transported and stored throughout the system in sticks, except when on the stage element for being presented for test. As result, the packages never come in contact with each other or with feed trays which can result in deleterious impact. Furthermore, because the system uses sticks throughout for transport, which sticks are configured for holding the packages in a substantially horizontal position, gravity is not used for stick transport. Instead, controlled drive systems are used. Hence, the entire system can be configured to avoid problematic accelerations, and hence reduce potential damage to the delicate integrated circuits being transported.

BRIEF DESCRIPTION OF THE DRAWINGS

FIG. 7A is an elevation view of an assembly of two auger elevators with a pinch roller drive between the elevators.

FIG. 7B is a plan view of FIG. 7A.

FIG. 20A is a side elevation view of an auger elevator at the unload side of a load/unload row showing how a stick is ejected from the elevator.

FIG. 20B is a plan view of the apparatus of FIG. 20A.

DESCRIPTION OF THE PREFERRED EMBODIMENTS

In order to present a full picture of the preferred embodiments of the invention, it is useful to break the following description into several independent sections which pertain roughly to the individual subsystems of the apparatus. These sections include descriptions of the handling stick, the stick as a transport tool, the auger assembly, the elevator assembly, elevator-to-elevator transport, elevator rows in an automated test handler (ATH), loading of elevator rows, movement of IC packages row-to-row, a single position pick-and-place mechanism, an X-Y stage and presentation module, a five zone slide module, automatic stick ejection, overall packaging and operation, and the digital control system.

The Handling Stick

In the Automated Test Handler (ATH) of the invention, IC packages to be tested are transported in protective pockets of a "stick", and sticks are handled only horizontally to avoid potentially damaging contact between IC packages during the necessary transport to and from presentation to test tooling. A stick is a carrier platen, preferrably formed of thin plastic material, and the protective pockets are indentions in which IC packages to be tested may be placed for transport.

Figure 1:
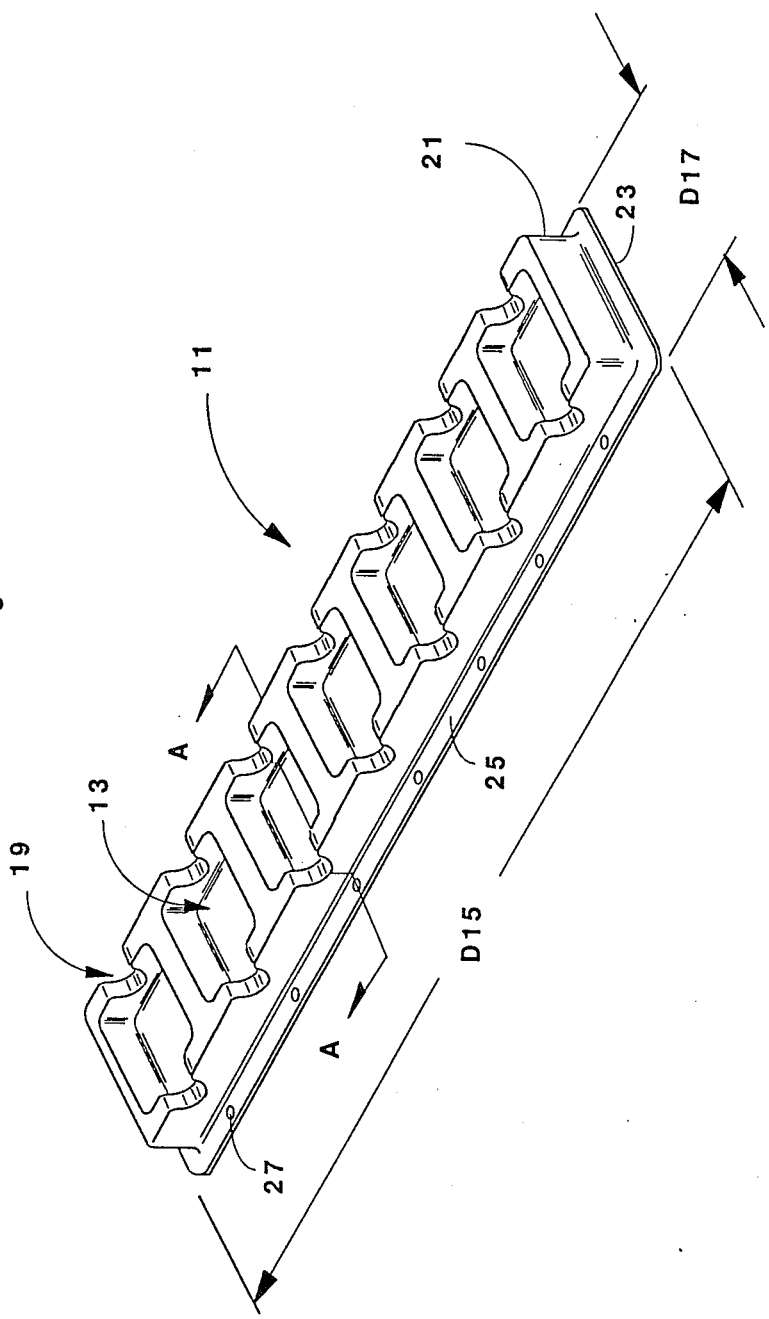
FIG. 1 is a perspective view of a stick according to a preferred embodiment of the invention in which device packages are transported.

FIG. 1 shows a stick 11 thermoformed from a thin heat-formable plastic material, according to a preferred embodiment of the invention. In this particular case the material is conductive ABS of approximately 0.15 cm. thickness, but other material and thickness may be used, and other processes than thermoforming may be employed in the manufacture of sticks. Electrically conductive material is preferred for sticks so that static charge build-up, that might otherwise damage ICs or cause anamolies during testing, might be avoided. For example, it might even prove useful to manufacture the sticks from sheet metal.

In this preferred embodiment there are seven pockets 13 formed in stick 11, although there may be fewer or more, and each pocket is a protective nacelle for a packaged IC to be tested. Length D15 of stick 11 is about 44.5 cm. and width D17 is about 7.6 cm. These dimensions are kept constant for an embodiment of the Automatic Test Handler of the invention, regardless of the number of pockets, because the mechanisms used to hold, move and position sticks are designed for sticks of common nominal dimensions. Across the width of a stick at each pocket there are access openings 19. These access openings are for finger access so that a stick may be conveniently loaded or unloaded manually, but they also serve for an unobstructed "view" laterally across a stick at each pocket. The latter feature is used in the ATH of the invention in conjunction with light sources and optical sensors to detect the presence or absence of IC packages in a pocket.

All pockets 13 are formed in a raised portion 21 of stick 11, and the height of portion 21 is such that the depression of a pocket is less than the height of the raised portion so that pockets do not form an obstruction to a flat bottom plane 23. There is a rim 25 all around the stick at the level of bottom plane 23, and the thickness of the rim is the thickness of the plastic sheet from which the stick is formed. Rim 25 is about 0.64 cm. wide on the two long sides of a stick and less than that dimension in width on the short ends. There are holes 27 through rim 25 about centrally located on the width of the rim, with one hole through the rim on each side of a stick at each pocket, the hole pair being on the lateral axis of symmetry of each pocket. The holes are for sighting by optical sensors of the ATH to aid in transporting and positioning sticks.

Figure 2:
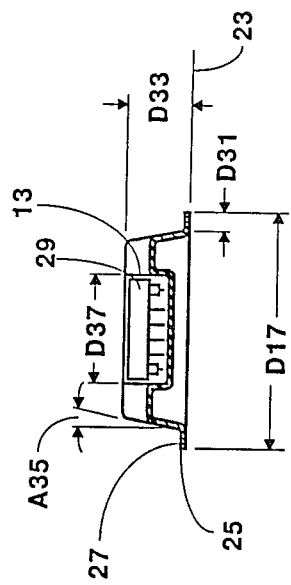
FIG. 2 is a section view of the stick of FIG. 1.

FIG. 2 is a lateral section through stick 11 along section line A—A of FIG. 1, bisecting a pocket along the axis of symmetry and passing through two holes 27 as well as the center of a pocket 13. A packaged IC 29, pins downward, is shown loaded into pocket 13. D31 is the rim width, and is typically about 0.6 cm. Height D33 is typically about 1.4 cm. Angle A35 is typically about 10 degrees, so that sticks may be stacked for manual handling, and when stacked (not shown) the stack height is about 0.97 cm.

These common dimensions: stick length, width, height, rim width, location hole diameter, stacking angle, etc., do not vary among sticks to be used with a particular embodiment of an ATH of the invention; but pocket dimensions may vary so that sticks may be made to transport particular packaged ICs for test. For the particular stick of FIG. 11 the pocket width is 5.16 cm., plus or minus 0.01 cm., and the pocket depth is 0.80 cm., plus or minus 0.01 cm. The pocket is formed for a Pin Grid Array (PGA) IC package which is, in nominal dimensions, 5.08 by 5.08 cm. square. It should be understood, however, that for differing widths or lengths of the ATH, ie. other specific embodiments, that the stick lengths, widths, etc., can be varied to accomodate the dimensions of the particular embodiment.

Figure 3:
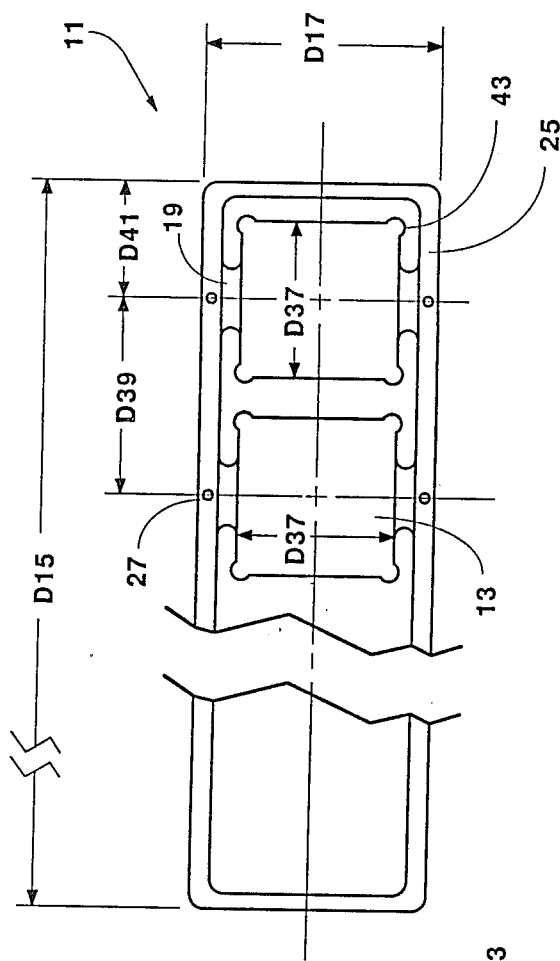
FIG. 3 is a plan view of the stick.

FIG. 3 is a plan view of stick 11 with two pockets shown to indicate the spacing for 5.08 by 5.08 cm. device packages in a stick. The plan view shows width D17 and length D15, two pockets 13 with width and length D37, rim 25, location holes 27, and access openings 19. Distance D41 from one end of the stick to the lateral axis of symmetry of the first pocket is 3.86 cm., and center-to-center distance D39 is 6.12 cm. It is seen that six spacings of 6.12 cm. plus two of 3.86 cm. for seven pockets results in a stick length D17 of 44.5 cm. In the molding of a pocket an intentional corner relief 43 is molded at each corner of each pocket. This relief insures that any jostling that might take place during handling will be bourne by the relatively broad sides of an IC package rather than concentrated at a corner, and also allows a closer tolerance between the pocket width and the IC package width, increasing precision in handling for an embodiment of the invention. For a 7.6 cm. stick width, the 5.08 cm. square IC package is about the largest that may be conveniently handled. Smaller packages may be handled by changing pocket dimensions to suit, arranging pockets linearly with a long axis of symmetry along the long axis of the stick, and adjusting center distances for equal spacing. As IC package width and length decreases, the number of pockets, hence the number of IC packages a single stick may carry, may be increased. For example, for a package with 2.54 by 2.54 cm. dimensions, there may be 12 pockets with D39=3.58 cm. and D41=2.54 cm. For device packages larger than the largest that can be accomodated in the preferred embodiment of the invention described, alternate embodiments are provided capable of handling sticks of larger dimensions, allowing transport of larger IC packages.

The Stick as a Transport Tool

An Automatic Test Handler according to a preferred embodiment of the invention accepts sticks loaded with IC packages to be tested, and up to the point that individual packages are removed one-by-one from a stick and presented to a pin straightener and a test head, transport is by moving the stick rather than by acting directly on the IC packages. Moreover, movement of sticks is in two directions only, vertically and in the direction of the length of a stick; and, while packages may be resident, plane 23 (FIG. 2) is maintained at all times horizontal. This feature eliminates jamming that is common to many kinds of test handlers and completely eliminates contact between packages, thereby eliminating damage that might result from such contact. After packages are unloaded for test, empty sticks are automatically unloaded from the ATH. Tested packages are placed in pockets in sticks identical to the load sticks, and these are moved to storage areas in the ATH corresponding to the test results. Transport after test, once a package is replaced in a stick, is entirely by stick movement and is with the stick maintained horizontal, as in the load operations, to eliminate jamming and potential damage to the IC's.

Sticks to be fed to the ATH of the preferred embodiment of the invention may be hand loaded with IC packages or loaded by automatic equipment, and that operation is not a part of this specification. Loaded sticks may be fed one-at-a-time manually to the ATH or, alternatively, provision may be made for sticks to be accepted from an automatic handling conveyor. Molded sticks of the design compatible with and a part of the preferred embodiment may be used for handling elsewhere than in the ATH; for example, as shipping trays for IC packages.

The Auger

Figure 4:
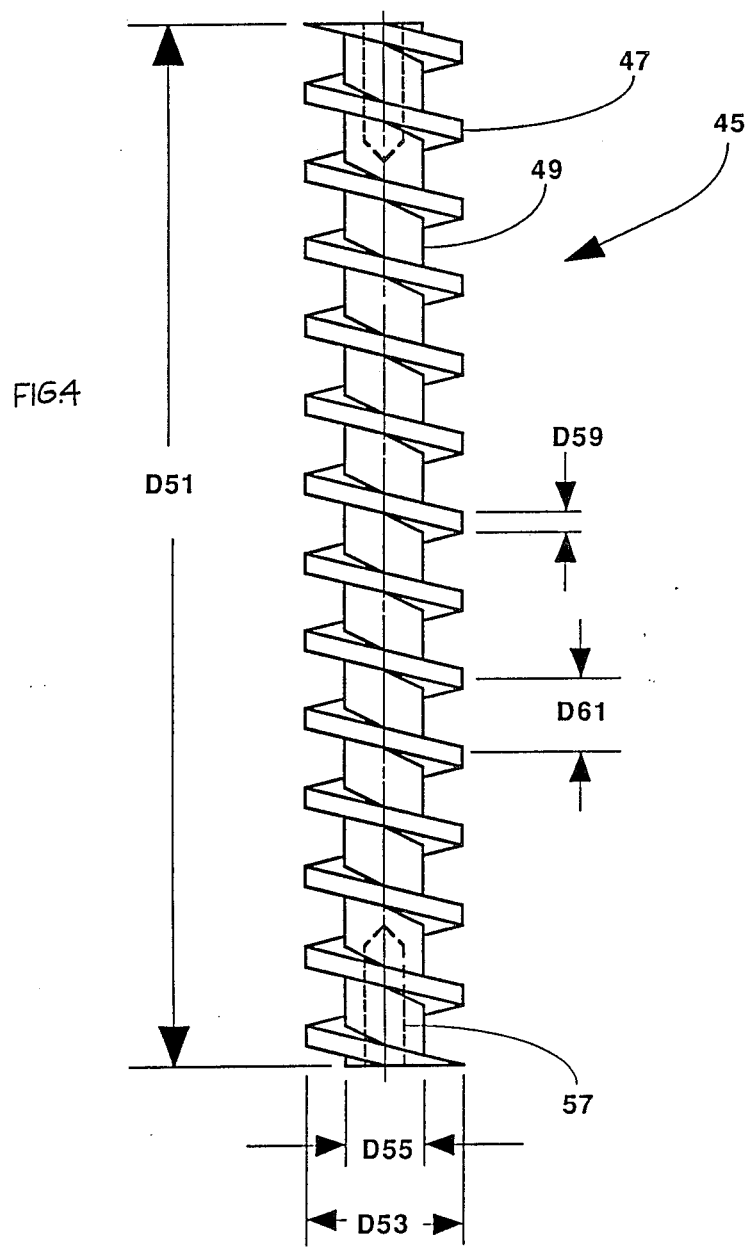
FIG. 4 is an elevation view of an auger used in an elevator according to the invention.

Movement of sticks within the ATH according to the preferred embodiment is vertically in elevators formed by spiral augers with sticks suspended by rims 25 (FIG. 1 and FIG. 2); and horizontally from one elevator to another by pinch rollers that act also on rim 25. FIG. 4 shows a single spiral auger 45. The auger is an inclined plane 47 wrapped around a central shaft 49. A typical auger in a preferred embodiment has a length D51 of about 30.5 cm., an overall diameter D53 of 2.54 cm., and a central shaft diameter D53 of 1.27 cm. An auger has a center hole 57 typically of 0.64 cm. diameter and 3.8 cm. depth at each end. In the ATH of the preferred embodiment, augers are preferrably injection molded elements and nylon is a preferred material; although other materials and forming methods may be used. The thickness D59 of the inclined plane of an auger is typically 0.38 cm., and the pitch D61 of an auger is typically 1.90 cm. All of these dimensions may vary considerably.

Auger Elevator

Figure 5:
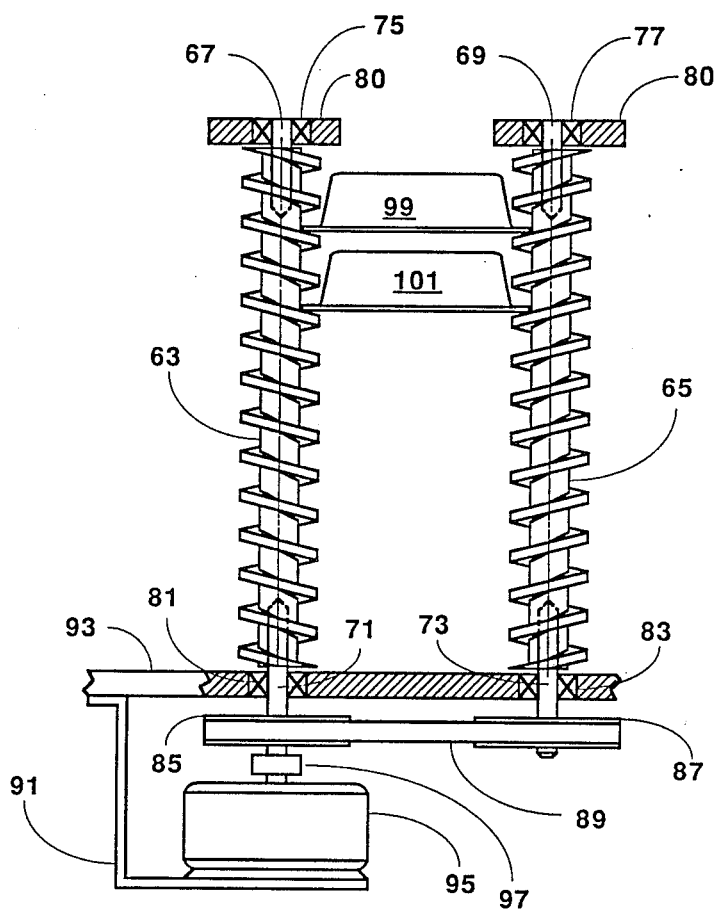
FIG. 5 is an elevation drawing showing from one end how augers may be used to make an elevator for sticks.

FIG. 5 illustrates how two augers are used to form part of a stick elevator. Auger 63 and auger 65 in FIG. 5 have metal end rods 67, 69, 71 and 73 pressed into the central end holes, and these rods are shafts for mounting and operating augers vertically. Auger 63 is mounted by end rod 67 into a bearing 75 through an upper mounting rail 79, which is a fixed part of the frame of an ATH of the preferred embodiment, and auger 65 is mounted by rod 69 through bearing 77 through a second upper rail 80. Separation of the upper rails, although both are fixed frame elements fastened together and to other frame members not shown, is to provide access from above to the pockets of a stick suspended by its rim on the inclined planes of the augers. These upper bearing mountings for the elevator are typically idler mountings, as driving of the augers is typically accomplished from below.

Auger 63 is mounted at the lower end by end rod 71 through bearing 81, which is fixed in lower mounting plate 93, and end rod 71 extends through the bearing and into a timing belt (cogged) pully 85. Auger 65 is similarly mounted by end rod 73 through bearing 83, also fixed in lower mounting plate 93, and end rod 73 extends into timing belt pully 87. A single timing belt 89 engages both pullys 85 and 87 so that when one turns the other turns at the same rate and in synchronization. End rod 71 extends through pully 85 and is fixedly engaged in a coupling 97 which connects end rod 71 to the driveshaft of a motor 95. The motor is mounted on a bracket 91 which is fastened back to a member that is part of the frame of the ATH. The drive motor is preferrably a stepper motor, but may also be a synchronous motor, a DC motor, or another type. There are a number of alternative arrangements by which the motor may drive the augers in synchronization and in a common direction of rotation, but the arrangement illustrated is a preferred arrangement.

The spacing of augers 63 and 65 is such that the distance between the central shaft of one auger to the central shaft of the other is slightly greater than the 7.6 cm. rim width of a stick. Sticks 99 and 101 suspended by their respective rims on the inclined planes of each of augers 63 and 65 may thus be moved up and down by rotating the augers in concert by means of motor 95. In the preferred embodiment the pitch of an auger is about 1.90 cm. and the height of a stick is greater than that, but less than 2.54 cm. Sticks may be suspended, then, in an auger elevator at 2.54 cm. intervals, and in an elevator made with augers of 30.5 cm. length, as many as 11 sticks may be temporarily stored. In other embodiments with different dimensions more or fewer sticks may be stored.

Figure 6:
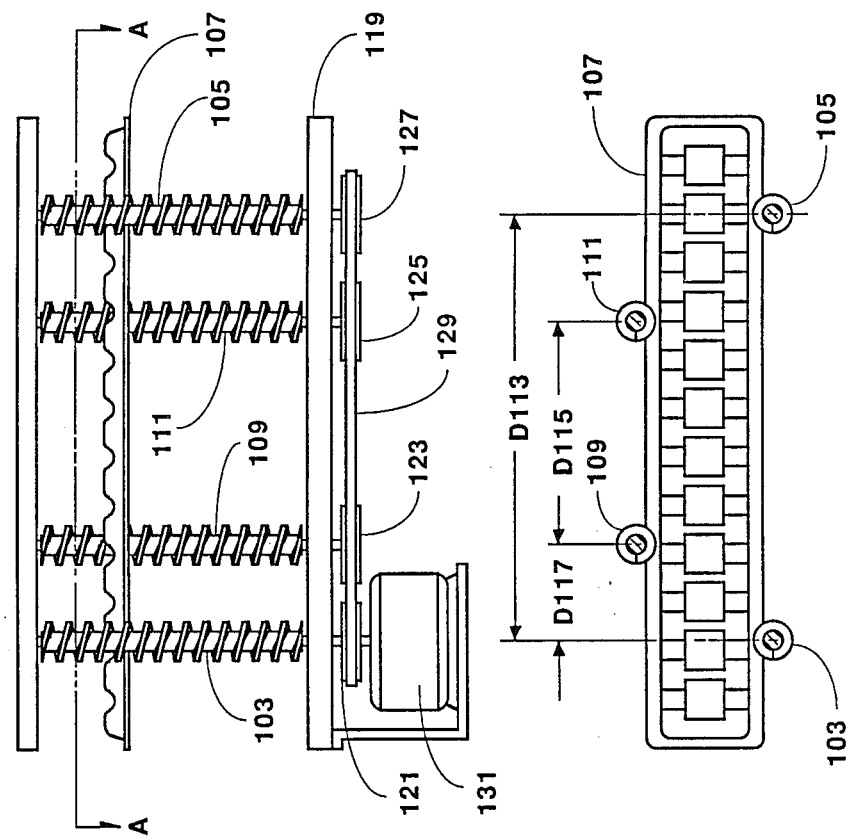
FIG. 6A is an elevation drawing showing from a side view how augers may be used to make an elevator for sticks.
FIG. 6B is a plan view of a auger elevator according to the invention.

Two augers will not, of course, form a stable elevator for moving sticks vertically while keeping the bottom planes of the sticks in a horizontal plane. FIG. 6A and FIG. 6B illustrate how four augers are spaced in the preferred embodiment to form a stable elevator. FIG. 6A is an elevation view, and 6B is a plan view. Augers 103 and 105 are on one side of stick 107 and are spaced apart a distance D113 of about 25.4 cm. Augers 109 and 111 are in the opposite side of stick 107, and are spaced apart a distance D115 of about 15.2 cm. Dimension D117 is then about 5.1 cm. The staggered arrangement makes it possible to place elevators close beside one another in an ATH, as the timing belt sprockets might otherwise interfere, as will be apparent with further illustration. The staggered arrangement also extends the support length for a stick in the elevator so that a stick being inserted into an elevator or withdrawn from an elevator by the pinch roller drive is supported by an auger of the elevator at a short distance from the pinch roller, providing maximum stability. In the elevator of FIG. 6A and 6B augers 103, 105, 109 and 111 are mounted by end rods through lower mounting plate 119 in bearings (not shown) and the end rods extend allowing timing belt pullys 121, 123, 125 and 127 to be mounted to the respective end rods. A single timing belt 129 connects all the pullys, and drive motor 131 drives all four augers to provide the elevator function for stick 107 and other sticks that might be inserted into the elevator. The augers on opposite sides of an elevator are mounted for opposite rotation, ie. the spiral for the augers on one side is left hand and for the augers on the other is right hand, so that the friction forces between the augers and the stick are balanced providing no net horizontal force on the stick as the elevator operates.

Elevator-to-Elevator Transport

The bulk transport function of an ATH of the preferred embodiment is by sticks which are inserted into the lower level of one auger elevator, raised up the elevator, moved across at the uppermost level to a second elevator, and lowered down the second auger elevator. FIGS. 7A and 7B show two auger elevators 133 and 135 of the type illustrated by FIG. 6A and B, built into single top rails, one of which, rail 137, is shown; and a single bottom plate 139.

Each elevator 133 and 135 is separately powered; motor 141 driving elevator 133, and motor 143 driving elevator 135. Each motor may be driven in either direction, to move a stick up or down a respective elevator. FIG. 7B is a plan view from section line A—A of FIG. 7A, and therefore does not show elements above the section line, such as the top mounting rails. There are two sticks shown: stick 145 in elevator 133 and stick 147 in elevator 135.

Dual auger elevators are used in several ways in an ATH according to the preferred embodiment. In some cases loaded sticks are inserted into an elevator and empty sticks are ejected. In other cases empty sticks are initially inserted, and loaded sticks are stored, to be removed later. Regardless of the use, the general priciples are the same. The usual starting point is an elevator loaded with sticks, either empty or full with IC packages. Transfer of IC packages to or from pockets of any stick takes place at the top level of an elevator. The actual point where pick up or placement may occur can be any of a number of points along the top level, but for such material handling to occur there needs to be a mechanism to move sticks horizontally lengthwise at the uppermost elevator level. This is done by a pinch roller module 159 associated with each dual elevator assembly in the ATH. Movement of sticks within an elevator and from elevator-to-elevator is monitored by use of optical sensor devices, which may be mounted to frame members at various points. Elements 161, 163, 165, 167, 169, and 171 in FIG. 7A are optical sensors. A fibre optic sensor 174 is used at the point at which packages are picked from a pocket, sensing across a stick via openings 19 in a stick, and sensing the presence of an IC package. If there is no package, there is no pickup. Pinch rollers and optical sensors are not shown in plan view FIG. 7B to avoid excessive detail.

Figure 8:
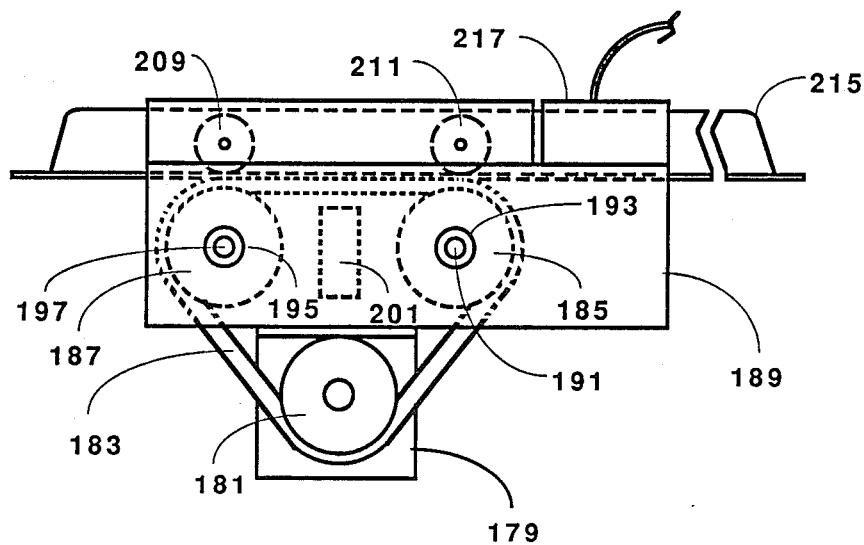
FIG. 8A is a side elevation view of a pinch roller mechanism according to the invention.
FIG. 8B is an end view of the pinch roller mechanism of FIG. 8A.
Figure 8:
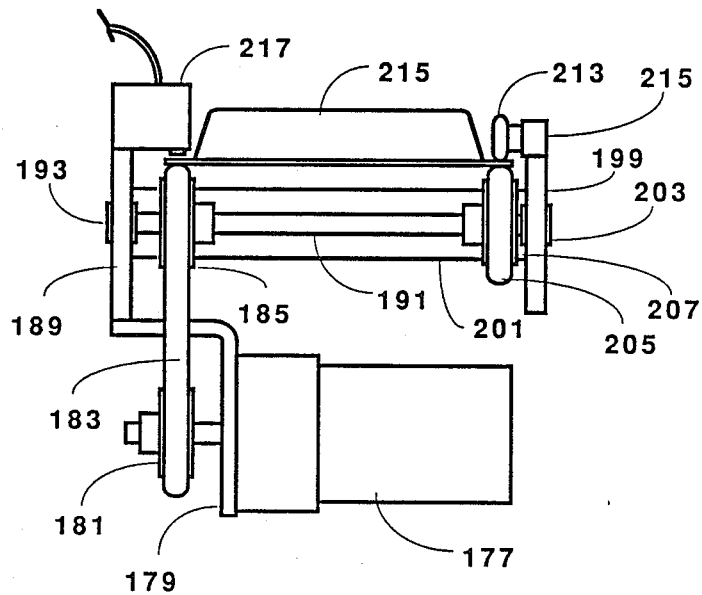

FIG. 8A is a side view enlargement of pinch roller module 159. FIG. 8B is an end view of FIG. 8A in the direction of arrow 190. Drive motor 177 mounted on bracket 179 turns pulley 181 which drives round belt 183. The round belt is polyurethane or other flexible material, and is stretched around idler pullys 185 and 187. Pully 185 is fixedly mounted on shaft 191 which is in turn mounted via bearing 193 into a side plate 189, the side plate being a main framing member of the pinch roller module. Pulley 187 is similarly mounted to a shaft 197 which is in turn mounted by a bearing 195 to side plate 189. A second side plate framing member 199 is spaced apart from side plate 189 by spacer plate 201, and shafts 191 and 197 mount in plate 199 by means of bearings similar to bearings 193 and 195. One of these bearings, 203, is seen in FIG. 8B. There are also two pulleys fixedly attached to shafts 191 and 197 on the same side of the pinch roller module as plate 199, and an endless flexible belt 205 is stretched around these pulleys. One of these pulleys, 207, is seen in FIG. 8B. Four small idler rollers are mounted in bearings above the pulleys that are mounted to shafts 191 and 197. Two of these, rollers 209 and 211, are seen in FIG. 8A. One roller, 213 can be seen mounted in bearing cap 215 on the plate 199 side in FIG. 8B. Belt 183 on one side and belt 205 on the other, together with the idler rollers, form a pinch roller pair at a width such that the rim on each side of a stick may be captured, and the stick may be moved in either direction along its length by means of operating motor 177. A pinch roller module also has an optical sensor 217 that senses holes in the stick rim. The holes that are sensed are holes 27 through rim 25 of the typical stick shown in FIG. 1. Pinch roller module 159 may thus move sticks at the uppermost elevator level in either direction from one of the auger elevators in a dual elevator assembly to the other, and through a digital controller, may sense holes in a stick rim and stop a stick so that pockets of the stick are sequentially presented to a single position.

Sticks moved up an elevator, such as one of the elevators of FIG. 7A and 7B, do not automatically engage in the pinch roller module at the top level. The pinch roller module resides in the area between the uppermost position for a stick at each elevator of the dual elevator assembly. As a result, a mechanism is needed to start a stick into the pinch roller module once that stick reaches the uppermost level of an auger elevator. The preferred mechanism for this purpose is a pneumatic cylinder. A cylinder 219 is shown mounted at the uppermost level of elevator 135 in FIG. 7A and a similar cylinder 221 is shown mounted at the uppermost level of elevator 133. A stick reaching the top-most level of elevator 133 may be started into pinch roller module 159 by extension of the shaft of cylinder 221. The pinch roller assembly will finally eject the stick in a position to be lowered into elevator 135. Similarly, a stick reaching the uppermost level of elevator 135 may be started into the pinch roller module by cylinder 219. A dual elevator assembly, depending on its use in the ATH, may not use both cylinders, and may therefore have only one cylinder mounted.

Elevator Rows in an ATH

Figure 9:
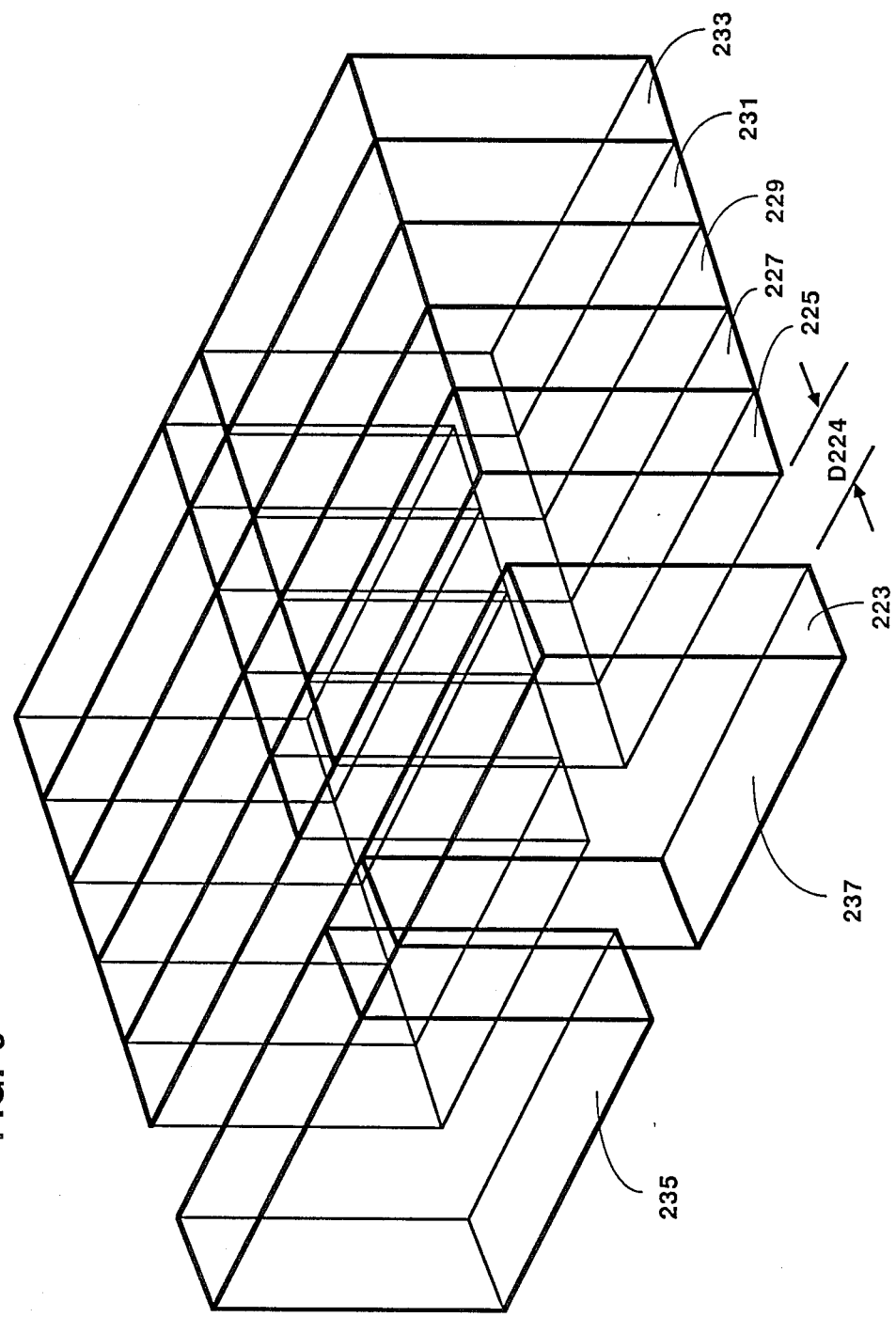
FIG. 9 is a perspective line drawing showing how elevator assemblies may be arranged in rows.

FIG. 9 is an "outline" drawing showing the arrangement of six dual elevator assemblies, placed substantially side by side in a common framework. This is the preferred arrangement in the preferred embodiment of the ATH of the invention. The six dual elevator rows have reference numbers 223, 225, 227, 229, 231, and 233, from one side of the ATH to the other. Box 235 represents an auger elevator at one end of row 223 and box 237 represents the other elevator of the pair that forms the dual elevator assembly of row 223. The same conventions hold for the other five rows. In the preferred embodiment row 223 is used for loading sticks containing IC packages to be tested and empty sticks are ejected automatically. Row 223, which is the load-unload row, is shown separated from the other five rows by a dimension D224 of about 7.6 cm. The purpose of this separation is to allow for panel enclosures for an environment chamber to be placed around row 223. The other rows arranged side-by-side are initially loaded with empty sticks, and each of these rows may be used for storing tested IC packages, the test result determining the storage row.

Loading Elevator Rows

Full sticks, that is, sticks with pockets containing IC packages to be tested, may be manually loaded to an ATH of the preffered embodiment, or, alternatively, may be automatically inserted by a material handling device. In the manual mode of loading (an operator selected control mode) sticks are inserted one-at-a-time into the lowermost level of elevator 237 in row 223. The dual elevator assembly of FIG. 7A may be used to illustrate this operation. In this case elevator 135 of FIG. 7A is equivalent to 237 of FIG. 9, and elevator 133 of FIG. 7A is equivalent to 235 of FIG. 9.

Beginning with both elevators empty, a full stick of devices to test is inserted lengthwise into the lowermost level of elevator 135 according to direction arrow 151. Sensor 165 in this instance is not used. When the inserted stick is fully in the elevator it is sensed by sensor 163. Motor 143 starts and rotates the four augers of elevator 135 in the direction to move the loaded stick in the upward direction of arrow 153. For the sticks illustrated in the preferred embodiment, being less than 1.90 cm. in height, and with augers of 1.90 cm. pitch, one full revolution is required. The revolutions are counted by an optical sensor 239 sensing a flag 241 fixedly attached to an extended end rod of one auger of the elevator. A similar sensor and flag module is standard at each auger elevator of an ATH of the preferred embodiment.

Once the first stick is elevated, the control system pauses for another to be loaded, and when a second stick is inserted, the operation repeats. When eleven sticks are loaded (for a 30.5 cm. tall auger elevator) there are no more open positions in elevator 135, and the uppermost stick in the elevator is sensed by optical sensor 171. This fact is recorded by the digital control, and no further sticks are accepted.

Storage rows (rows 225, 227, 229, 231, and 233) are loaded with empty sticks in a manner similar to the loading of row 223, except the empties go into the "back" elevator, on the end of the machine represented by elevator 235 of FIG. 9. Using FIG. 7A for illustration, an empty stick is inserted at the lowermost position of elevator 135, as before. Elevator 135 does not operate, however. Another empty stick is used to push the first empty stick on through into the lowermost position of elevator 137. When the first empty stick arrives in the "back" elevator, sensor 167 senses that arrival and signals the digital controller to elevate the empty stick in the up direction of arrow 157 for one revolution. This operation, repeated eleven times, loads the "back" row of a dual elevator assembly with empty sticks. The empty stick used to push the eleventh and final empty into position is manually withdrawn. The arrival of the first loaded empty stick at the uppermost level is sensed by sensor 169, and no more empty sticks are accepted. In this manner all storage rows may be loaded with empty sticks in the "load" mode. Thus the entire apparatus may be loaded from one side.

Movement of IC Packages Row-To Row

Figure 10:
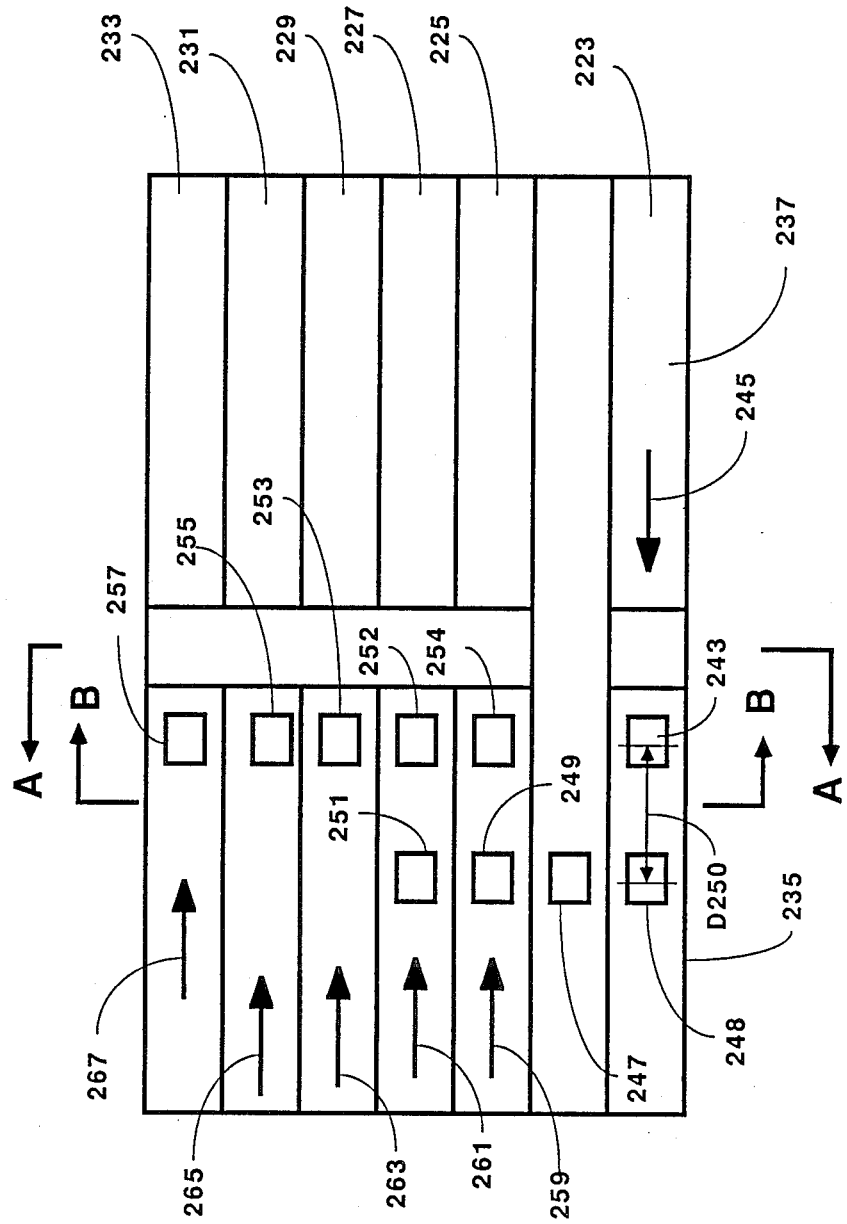
FIG. 10 is a top plan view of the arrangement of transfer positions for device packages in an automated test handler (ATH) according to the invention.

FIG. 10 is a grid pattern that is a top plan view of the row arrangement of dual elevator assemblies illustrated in FIG. 9. Loaded sticks come up the auger elevator at 237, are started into a pinch roller module and move across the upper level in the direction of arrow 245. By sensing holes in the stick rim with the optical sensor incorporated with the pinch roller, the loaded stick is stopped when the first IC package to be tested arrives at approximately the position of rectangle 243. This is where pickup from a pocket occurs in the load-unload row.

An IC package is picked up by a suction cup pick-and-place mechanism at position 243 and is placed on a three-position X-Y stage above the elevator rows at position 248, which is about 30 cm. above the stick position in the uppermost elevator level. The pick-and-place mechanism turns the IC package so that the pins face upward, and in the transfer, there is a movement D250 of about 12.7 cm. in the direction of stick transfer in load row 223. The X-Y stage moves the IC package laterally to position 247 where a 2-position z-motion presentation module takes the IC package, pins facing upward, and raises it to a first of two test positions for presentation to an externally provided test apparatus (not shown). The first of the two test positions is typically a pin straightener. As the first IC package is engaged at the first test position, the stick in the uppermost elevator level in the load row is moved by the pinch roller module by one pocket position, and a second IC package is picked up from the stick. As the second package is placed on the X-Y stage, the first is placed back on the X-Y stage at position No. 2. The X-Y stage now moves both packages laterally, the first going to a second test position 249 over row 225 where electrical tests are performed, and the second going to the first position of the presentation module. Further operations move the first package over to row 227 at position 251, where the tested package is picked from a nest of the X-Y stage and placed by a single position pick-and-place mechanism to position 252 into an empty pocket of a stick moved across the upper level of row 227 by a pinch roller mechanism, in the direction of arrow 261. After a package arrives at position 252 a five-row transfer mechanism is activated that has the ability to move laterally across the five storage rows 225, 227, 229, 231 and 233, as well as to pick up and replace IC packages at each of the rows. After picking up a package from a pocket of a stick at position 252 the five-row transfer mechanism can move in one direction and place the package in a pocket of a stick in row 229 at position 253, in row 231 at position 255, or in row 233 at position 257. Alternatively the five row transfer mechanism may move in the opposite direction and place the package in a pocket of a stick in row 225 at position 254. As another alternative, a tested package may remain in the stick in row 227. There are, then, five choices of placement rows for tested packages, and the test result for each package in conjunction with the digital control for the ATH determines the storage destination of a tested package.

For the case where load elevator 237 is loaded manually with sticks, testing will be automatically interrupted when the last package of the last loaded stick is tested and sent to a storage destination. Interruption will also take place if all of the empty sticks in any storage row are filled, and the "front" storage elevator of any such row becomes full. Arrows 259, 261, 263, 265 and 267 indicate the direction of movement of sticks in storage rows 225, 227, 229, 231 and 233 respectively.

Single Position Pick-And-Place Mechanism

Figure 11:
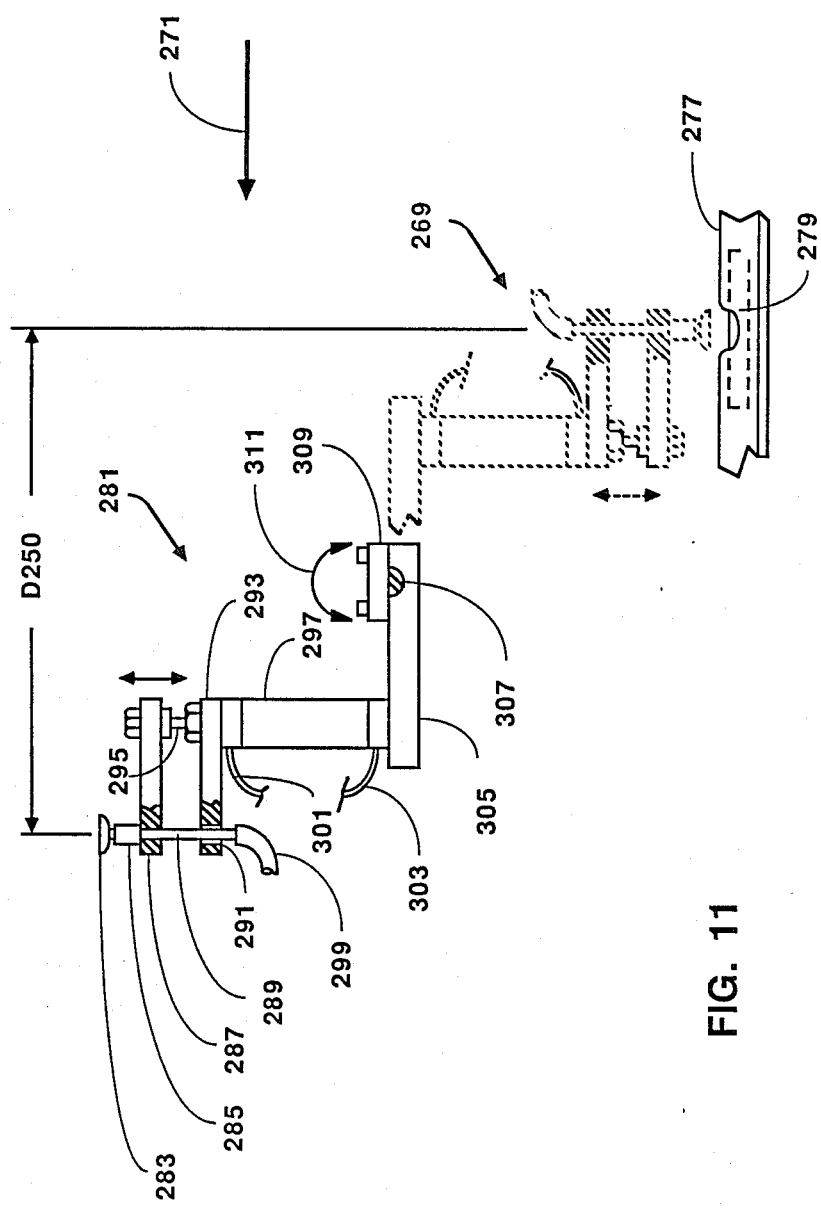
FIG. 11 is an elevation view of a pick-and-place mechanism used with the ATH.

A pick-and-place mechanism 281 serving a single row is illustrated by FIG. 11. This mechanism is used in the preferred embodiment to pick IC packages from pockets in row 223 and to replace them in pockets in row 227, transferring to and from a three position X-Y stage to be illustrated.

Stick 277 is at the uppermost level of either row 223 or 227, and is engaged in the pinch roller module of the dual elevator of that row (not shown). Stick 227 is positioned so that a pocket with an IC package 279 is aligned such that the IC package may be picked by the pick-and-place mechanism. If stick 277 is in row 223, IC package 279 is at point 243 of FIG. 10. If the illustration is considered for row 227, the IC package position in the stick pocket is position 252 of FIG. 10. Mechanism 281 has a suction cup 283 mounted on a cup-holder 285 which is fixedly mounted to an extending arm 287. The cup holder is connected to a rigid tubing 289 which passes through a clearance hole 291 in a second arm 293. Extending arm 287 is fixedly attached by means of conventional fasteners near the end of extendable shaft 295 of a pneumatic cylinder 297. Tubing 289, which is attached to the suction cup, is connected at the other end to flexible tubing 299. A valve (not shown) connected to tubing 299 allows the line to the cup to be connected alternately, when desired, to a vacuum source and to a vent (exhaust) port. The valve is a solenoid valve controlled by the digital control of the ATH.

Pneumatic cylinder 297 is caused to operate by lines 301 and 303, which are connected to ports of a four-way solenoid operated valve also operated by the ATH controller. Air pressure applied to line 301 while venting line 303 causes the shaft of the cylinder to retract, moving arm 287 closer to arm 293, and reversing the pressure and vent ports causes the cylinder shaft to extend, moving arm 287 away from arm 293. The limits of extension and retraction of cup 283 relative to the rest of the mechanism may be controlled by conventional means, such as blocks internal to cylinder 297 and the position at which arm 293 is fastened to shaft 295.

Cylinder 297 is rigidly attached at the closed end to arm 305, and the cylinder is thus a main structural member of the mechanism as well as a motive device. Arm 305 is rigidly attached to a rotatable shaft 307 by means of a pinch-bind cap 309 and a flat on the shaft, so as the shaft rotates the whole mechanism will rotate according to direction arrow 311.

There are two rotational positions the pick-and-place mechanism may assume. The mechanism of FIG. 11 is shown primarily in the "upper" of the two positions, with cup 283 pointing directly upward. The mechanism is shown in phantom view in the second of the two rotational positions, the cup positioned over IC package 279 in a pocket of stick 277.

At row 223, where IC packages are picked up, package 279 is at position 243 of FIG. 10, and operation is as follows, beginning with the mechanism in lower rotational position 269: Pneumatic cylinder 297 is activated extending cup 283 to contact the flat upper surface of IC package 279, at which time a valve is shifted to provide vacuum to the cup, and the IC package is picked up. Pneumatic cylinder 297 is now retracted, retracting the cup and IC package upward to clear the pocket of stick 277. Shaft 307 rotates counter clockwise, rotating the mechanism to the position of 281. During rotation the pneumatic cylinder shaft is extended. After rotation, an X-Y stage (not shown in FIG. 11) is extended to place a nest below the IC package, and the cylinder shaft is retracted while at the same time the vacuum/vent control valve serving the suction cup is shifted to vent the cup, leaving the IC package, pins up, in the nest of the X-Y stage. The new position of the IC package is position 248 of FIG. 10, and dimension D250 is the same dimension D250 of FIG. 10. At row 227, operation is reversed, taking IC packages from the X-Y stage and placing them into a pocket in a stick with clockwise rotation of a shaft equivalent to shaft 307

Figure 12:
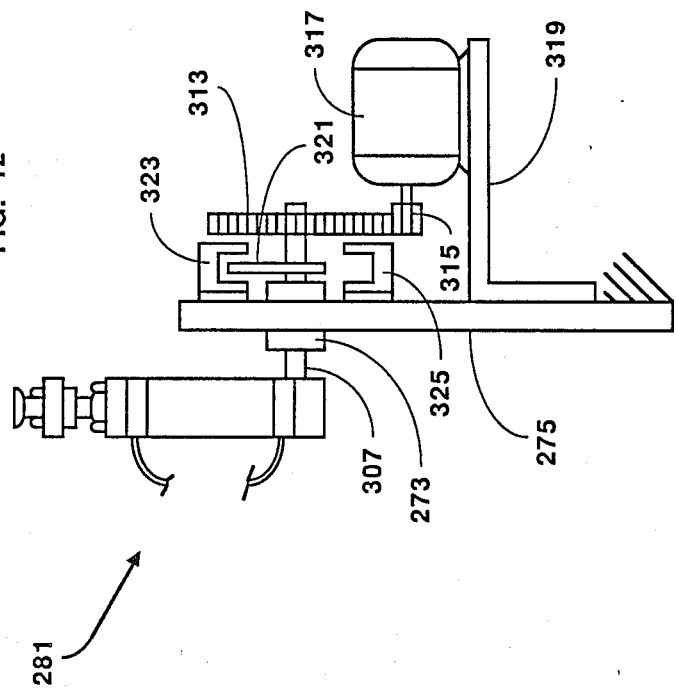
FIG. 12 is an end view of the pick-and-place mechanism of FIG. 11.

FIG. 12 is a view of the pick-and-place mechanism of FIG. 11 in the direction of arrow 271. Shaft 307 extends through a bearing assembly 273 which is mounted in a frameplate 275. Pick-and-place assembly 281 is thus cantilevered from the frame plate. On the opposite side of the frame plate shaft 307 extends further. A gear 313 of about 15 cm. diameter is mounted on the shaft and engaged by a pinion 315 which is mounted on the output shaft of a motor 317. The motor is mounted to frame plate 275 on a mount bracket 319. Also on the motor side of frame plate 275 there are a "flag" 321 mounted to rotate with shaft 307 and two optical sensor devices 323 and 325 mounted to frame plate 275, such that sensor 323 is blocked when the pick-and-place apparatus is in the upper position and sensor 325 is blocked where the pick-and-place is in the lower position; the two positions being those illustrated by FIG. 11 and being 180 degrees apart. Rotational operation is accomplished by running motor 317 in the needed direction in response to signals from the digital controller of the ATH, stopping the motor (hence stopping rotation of the pick-and-place mechanism) when signalled by one or the other of the optical sensors 323 or 325.

A pick-and-place mechanism as illustrated by FIG. 11 and FIG. 12 can be assembled to either side of a frame plate. The mechanism serving load row 223 has the frame plate to the left when viewed toward the "back", that is, in the direction of travel of sticks in load row 223. The mechanism serving row 227, placing tested IC packages into pockets of a stick, has the frame plate to the right viewed in the same direction.

X-Y Stage And Presentation Module

Figure 13:
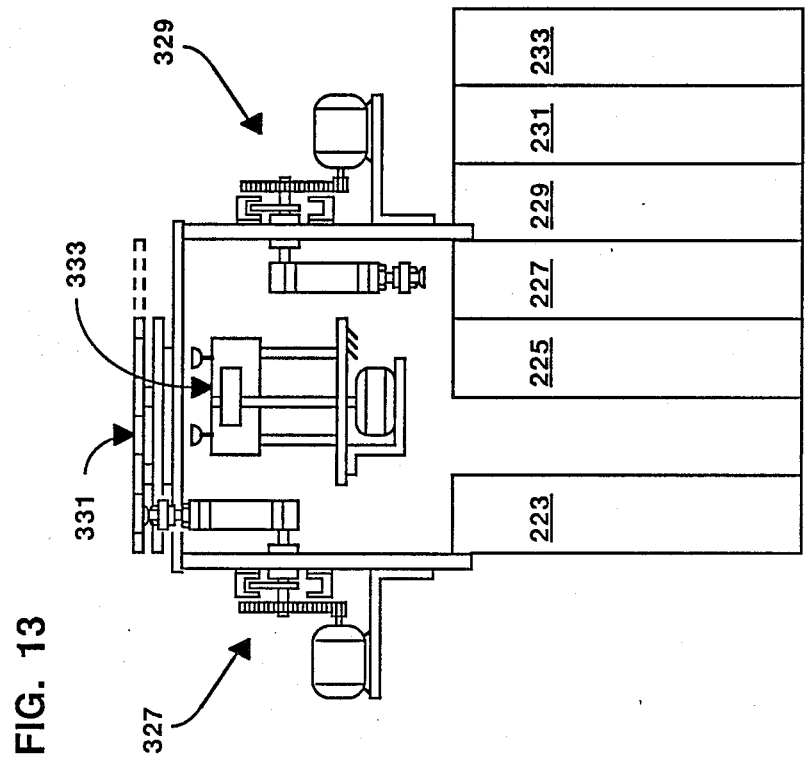
FIG. 13 is an end view of the ATH showing the placement of discrete device transport elements laterally across the ATH.

FIG. 13 is a view above the elevator rows of an ATH of the preferred embodiment, taken along line A—A of FIG. 10 in the direction of the arrows. The view is looking toward the "back" of the machine, in the direction that sticks move in load row 223. A pick-and-place mechanism 327 is shown in a position to serve load row 223, and another pick-and-place mechanism 329 is shown in a position to serve row 227. IC packages to be tested are picked from row 223 (at point 243 of FIG. 10), tested, and placed in row 227 (at point 252 of FIG. 10). There are two mechanical modules for handling IC packages between the two pick-and-place mechanisms. X-Y stage 331 is a mechanism for moving IC packages from the upper position of pick-and-place mechanism 327 to a first of two positions of a two-position presentation module 333; from the first to the second position of module 333; and finally to pick-and-place mechanism 329 for placement in an empty pocket of a stick in row 227.

Figure 14:
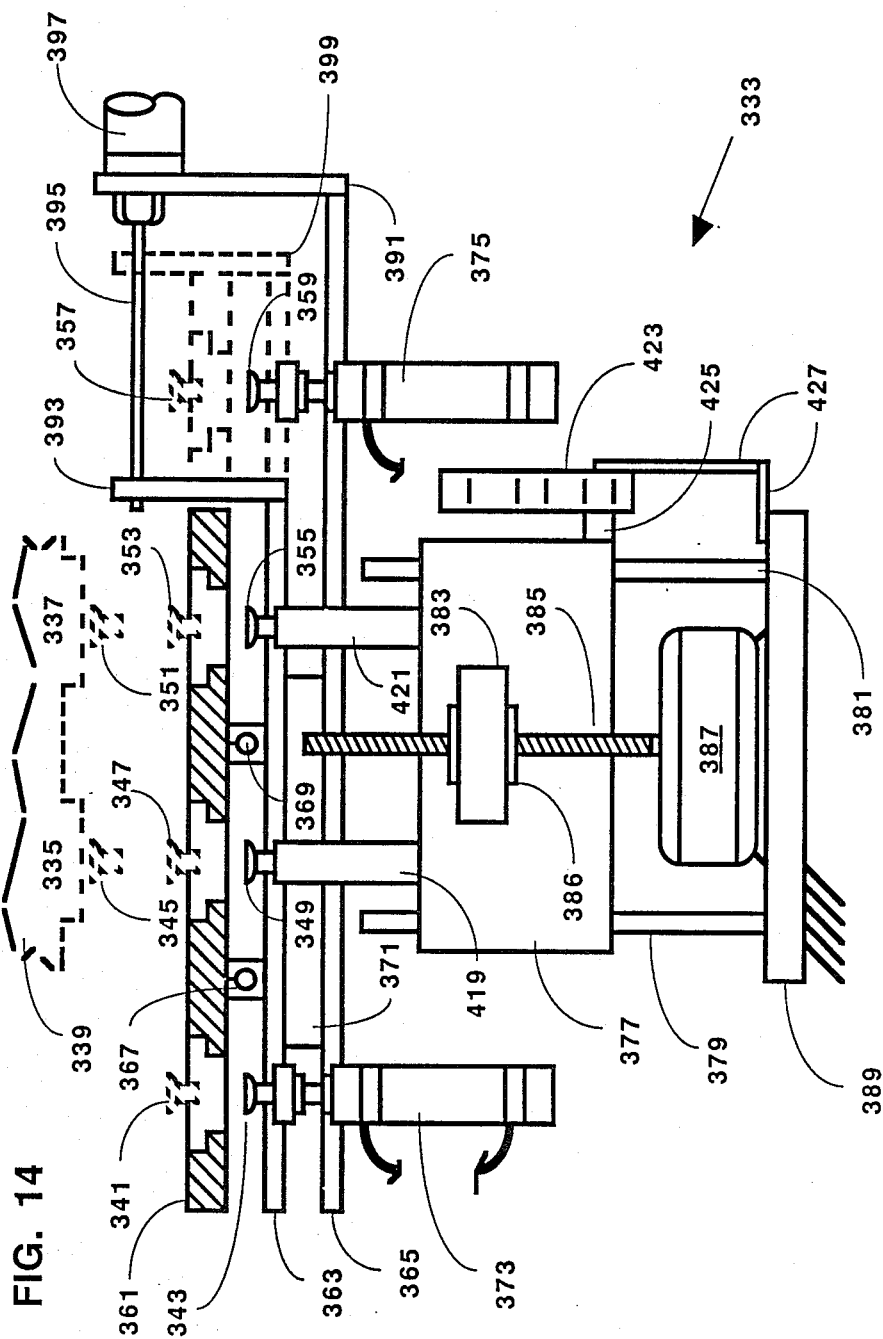
FIG. 14 is an enlarged view of the placement of device transport elements of FIG. 13.

FIG. 14 is a face-on view of an X-Y stage according to the preferred embodiment, and is an elarged view in the same direction as FIG. 13. The X-Y stage has a lower plate 365 which is a mounting plate fixed to the frame of the ATH. A middle plate 363 is mounted to fixed plate 365 on a ball slide 371, which allows the middle plate to have lateral movement in the direction across the elevator rows of the ATH, but not in another direction. A nest plate 361 with three nest positions is mounted to and above the middle plate on two ball slides 367 and 369, and the nest plate thus is allowed motion in the direction of stick travel in the ATH relative to the middle plate of the X-Y stage. A pneumatic cylinder 397 is mounted to a bracket 391 which is attached to fixed plate 365, and the extendable shaft 395 of the cylinder is fastened near the end to a bracket 393 which is mounted to middle plate 363. Retraction of shaft 395 moves plates 363 and 361 together along ball slide 371 as far as point 399. Extension of shaft 395 moves both plates together in the opposite direction.

Figure 16:
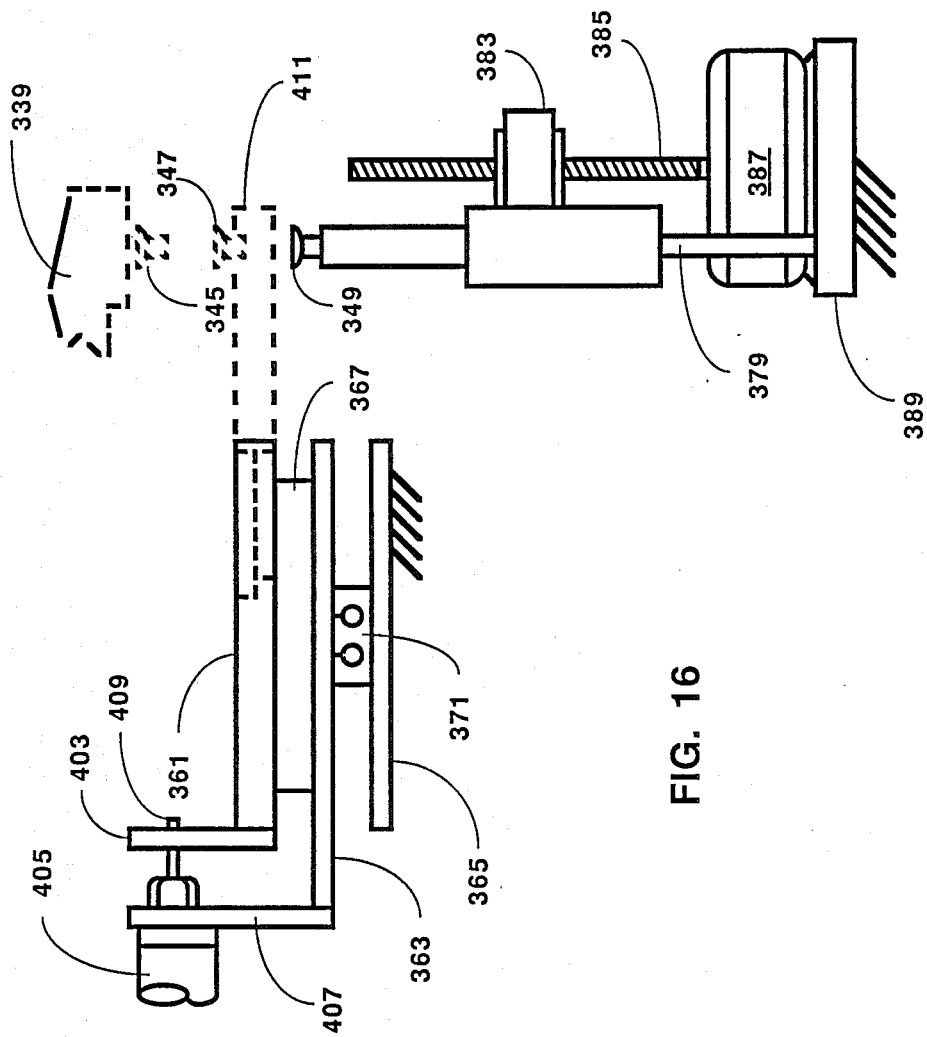
FIG. 16 is a side view of the X-Y Stage and the Presentation Module of the ATH.

FIG. 16 is a side view of FIG. 14. In FIG. 16 a second pneumatic cylinder 405 is shown mounted to a bracket 407 which is fastened to middle plate 363. Extendable shaft 409 of cylinder 405 is fixed in bracket 403, which in turn fastens to nest plate 361. Extending the shaft of cylinder 405 moves nest plate 361 to position 411 along ball slide 367 and ball slide 369 (not shown in FIG. 16), and retracting it returns the nest plate to the original position.

Figure 15:
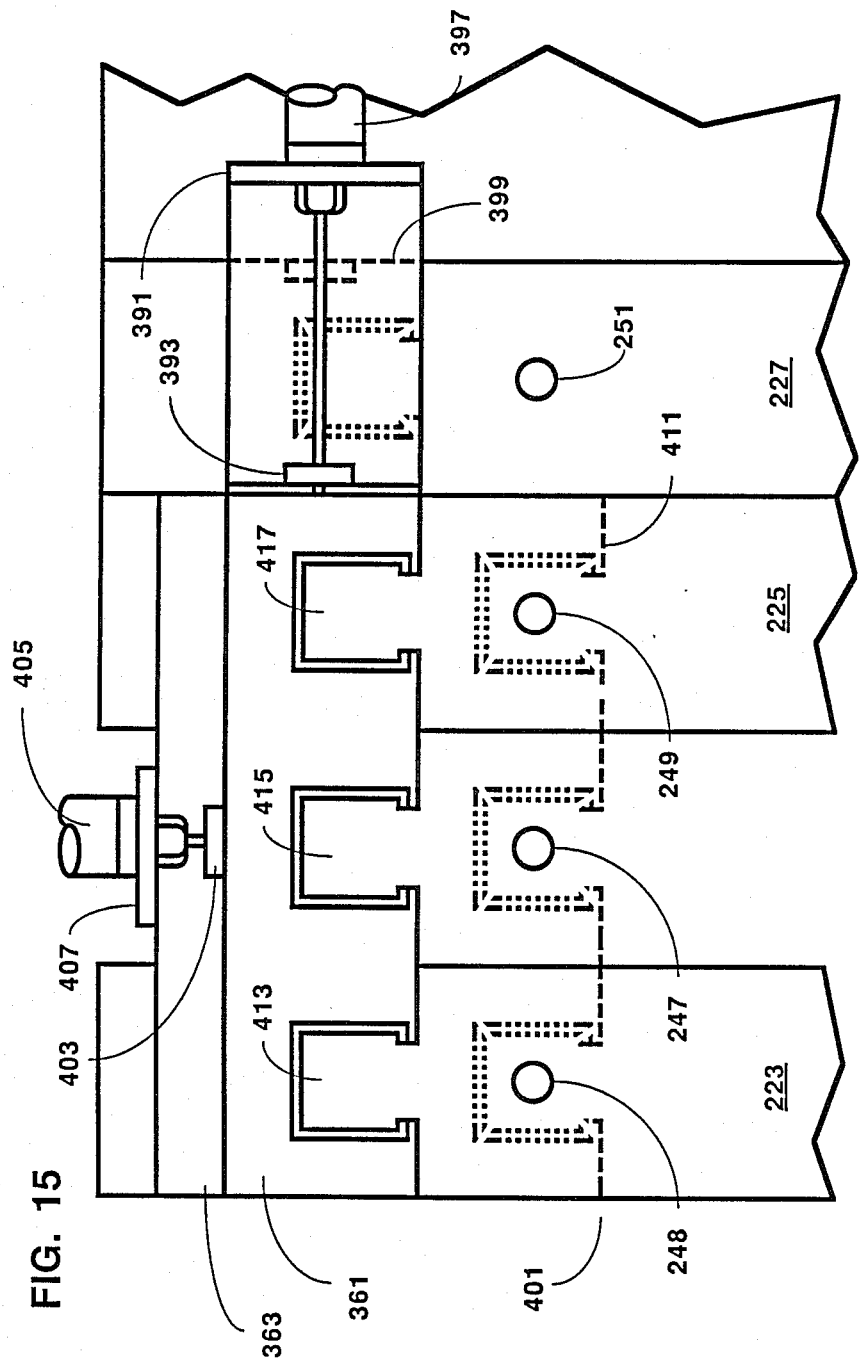
FIG. 15 is a top plan view showing an X-Y Stage, its motion elements, and the placement relative to rows of the ATH.

FIG. 15 is a plan view of FIG. 14, and shows both cylinders 405 and 397 that manipulate the X-Y stage. Nest plate 361 has three nests 413, 415, and 417 which are configured to accept and hold IC packages of a size to be tested. Manipulation of the two pneumatic cylinders can move the three nests together from the position shown out to position 411 and back, and from the position shown over to position 399 and back.

FIG. 14 additionally shows two-position presentation module 333 and portions of the module are shown as well in side elevation view FIG. 16. Presentation module 333 is assembled on a fixed frame plate 389 which is attached to the frame of the ATH. There are two guide rods 379 and 381 mounted into the frame plate, and a carriage block 377 travels vertically constrained on these rods in linear bearings (not shown). A nut housing 383 is fastened to the carriage block and carries a ball nut 386. A motor 387 mounted to plate 389 drives a ball screw 385 which passes through ball nut 386 in nut housing 383. Rotation of motor 387 in one direction raises carriage 377, and rotation in the opposite direction lowers the carriage. The motor is preferably a stepping motor, but may be a sychronous motor or other type. Carriage 377 carries two hollow shafts 419 and 421 and each has a suction cup at the upper end. Cup 349 is the holding point of the first position of the two position presentation module, and cup 355 is the holding point of the second position. By operating motor 387 cups 349 and 355 may be moved from the position shown to positions 347 and 353, where they are above the level of the nest positions of the X-Y stage; and they may be moved further to positions 345 and 351, which are positions where IC packages are presented to a pin straightener and a test head. Cups 349 and 355 are connected through hollow shafts 419 and 421 and by flexible lines (not shown) to control valves (also not shown) in the manner described earlier for the suction cups used with the pick-and-place mechanisms. The digital controller of the ATH can control the supply of vacuum to the cups and can switch from vacuum to vent (exhaust) as required. A flag 425 fastened to carriage 377 is used in conjunction with an optical sensor assembly 423 to sense the positions for the carriage travel. Assembly 423 has three sensors, one for each of the three carriage positions, and the assembly is mounted to plate 389 by brackets 427.

The purpose of the transfer devices described is to move IC packages from pockets of a stick in row 223, to present them one at a time to a pin straightener and a test head, and to return them to pockets of a stick in row 227. The test head positions are a part of a structure 339 which is not a part of the ATH. This separate structure has two positions 335 and 337, which are positioned over the ATH with position 335 directly over point 247 of FIG. 10, and position 337 directly over point 249 of FIG. 10.

An IC package picked from a pocket of a stick in load row 223 is moved with the rotation of the pick-and-place mechanism to position 341 of FIG. 14, above the level of the nest plate of the X-Y stage. Extension of the shaft of cylinder 405 moves the nest plate out to line 411, which moves nest 413 under the IC package. Retracting the cylinder of the pick and place and at the same time venting the cup places the IC package into nest 413. Retracting cylinder 405 moves the IC package in nest 413 along with the nest plate to the primary position shown in FIG. 15. From this point cylinder 397 is retracted and nest 413 moves to the position shown as nest 415. Extending cylinder 405 then moves nest 413 over the first of the two positions of the two-position presentation module. The presentation module carriage 377 is driven upward, and cup 349 goes to position 347.

The control valve is switched during the travel to capture the IC package on the up stroke, and the package goes with cup 349 to position 347. The nest plate now retracts, and then the presentation module carriage is driven upward to take cup 349 and the IC package to position 345, where the pins of the package engage in test head 335. In the preferred embodiment, test head 335 is a pin straightener, but the position could also be used for electrical tests.

After engagement in test head 335, the IC package is lowered again to position 347 by lowering the carriage of the two position presentation module, the nest plate is extended to bring nest 415 under the package, and the carriage is further lowered while venting the cup, to place the package in nest 415. At this time a next package is placed in nest 413 by the procedure previously described. A repetition of the sequence moves the first package to the second of the positions of the two-position presentation module, and the second package to the first position. Another extension of the presentation module now presents the first package to test head 337 and the second package to test head 335. In the preferred embodiment test head position 337 is to perform electrical tests.

While the presentation module operates, the pick-and-place mechanism at row 223 picks a third IC package and rotates to the upper extended position. With the presentation module retracted to positions 347 and 353 and the third IC package in position at 341, the nest plate is extended and the IC packages are placed into the nests. The next operation of the X-Y stage takes the first IC package to the pick-and-place mechanism that serves row 227, and this first package, having been presented at both test head positions, is placed into a pocket of a stick in row 227. Continued sequencing of the mechanisms in the manner described moves IC packages one-at-a-time from sticks in load row 223 and into pockets of a stick in row 227 with every IC package being presented sequentially to both of test heads 335 and 337 in order.

Five Zone Slide Module

As indicated earlier, when an IC package is placed in a pocket of a stick in row 227 by the single position pick-and-place mechanism serving that row, the package has been through the test heads, and information has been recorded concerning the test results. Although the test heads are not typically controlled by the digital controller of the ATH, the ATH controller can accept signals from the controller that does manage the test stations, and can be pre-programmed to route the tested packages to specific rows of the ATH as a result of the tests. The "first" row of the ATH, row 223, is the load-unload row, by which packages to be tested enter the ATH and empty sticks are handled once the packages have been removed for testing. All the other rows, (225, 227, 229, 231 and 233) are available for storing tested packages according to the test results. For example, the ATH may be programmed to store all packages that are tested as "acceptable" in row 227, which is the row into which all tested packages are initially placed after testing; and to store other packages (that fail the electrical tests) in one or another of the other four rows by dividing each "failure" into one of four classifications, and using that criteria to initiate control sequences in the ATH to cause the appropriate transfers to be made. Similarly, there may be one "failure" row, and various degrees of acceptability, depending on the nature of the specified product, eg. does it have to meet a particular military specification, or less stringent consumer requirements? Clearly, a very broad range of variations is available as to how these divisions may be made, and the implementation is typically a software function. Row classification can be changed by the end user with input through the control panel.

Figure 17:
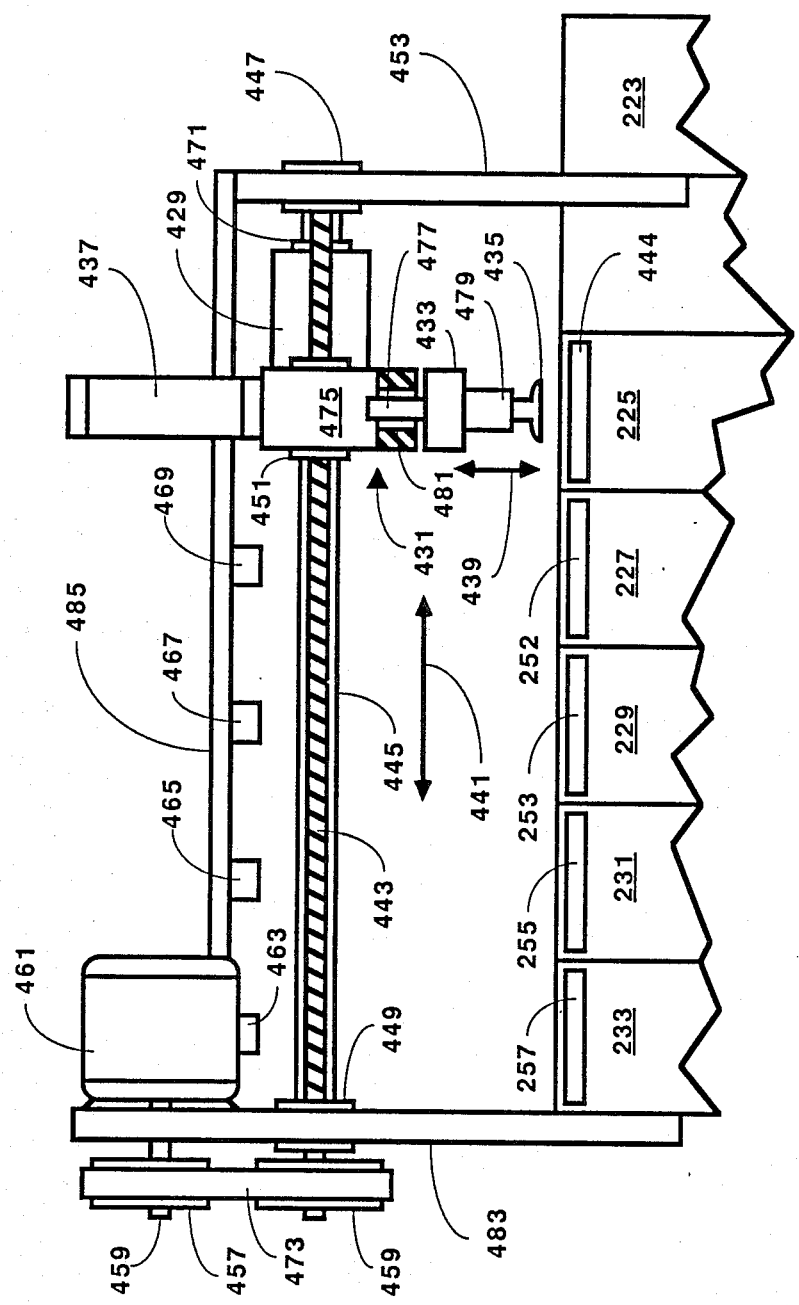
FIG. 17 is a face-on view of a Five Zone Slide Assembly of the ATH.

FIG. 17 is an elevation view of a five zone slide module for picking tested packages from row 227 and placing them into sticks in one or another of the other four storage rows. The view of FIG. 17 is along line B—B of FIG. 10 in the direction of the arrows, which is toward the "front" of the machine; opposite the direction of FIG. 13 and FIG. 14. The five zone slide module has a pick-and-place assembly 431 for picking packages from a pocket in one row and placing them in a pocket in another. A pneumatic cylinder 437, fixedly mounted to a housing 417, acts through the housing by means of its extendable shaft (not shown) to operate an arm 433. Arm 433 has a fixed extension 479 to which a suction cup 435 is attached, and the cup is connected through the extension and arm 433 to a tubing 477. The pneumatic cylinder is connected by tubings (not shown) to a four way solenoid control valve operated by the digital control of the ATH. Shifting the control valve one direction extends the cylinder shaft to move cup 435 down to contact a package in a pocket of a stick in one of the rows of the ATH; and when in contact, a separate solenoid control valve (also not shown) is shifted to connect a vacuum source to tubing 477 by means of flexible tubing connected for that purpose. The package contacted adheres to the vacuum cup by virtue of the vacuum, and shifting the solenoid control valve dedicated to the pneumatic cylinder again causes the cylinder shaft to retract lifting the cup and the package with it to a height above the stick in the pick-up row (227) at which lateral movement will not be obstructed. Arrow 439 shows the direction of movement of cup 435 during pick-up and placement of packages. Tubing 477 passes through a clearance hole 481 which guides the assembly during vertical operation.

Housing 475 is rigidly attached to a bearing housing 429 which has linear bearings, one of which, 471, is seen in FIG. 17. The linear bearings travel on a bearing shaft 445 that extends laterally across the rows of the ATH and is fixedly attached at each end to vertical frame members 453 and 483. At about the same height as bearing shaft 445, housing 475 has a lead screw nut 451 mounted, and a lead screw 443 passes through the nut parallel to bearing shaft 445. The lead screw is mounted to a vertical frame member 453 in a bearing 447 at one end, and at the opposite end through a similar bearing 449 in vertical frame member 483. Lead screw 443 extends through a timing belt pulley 459 which has a timing belt 473 connecting it to a second timing belt pulley 457 mounted to the output shaft of a drive motor 461. The motor is mounted on the same side of vertical frame member 483 as is bearing shaft 445 and the pick-and-place assembly. The drive pulley arrangement is on the opposite side.

Running motor 461 in one direction rotates the lead screw and causes the pick-and-place assembly to travel laterally in one direction across the rows of the ATH. Running the drive motor in the opposite direction moves the pick-and-place assembly laterally in the opposite direction. Arrow 441 indicates the lateral travel directions. The span of framing members 453 and 483 is such that the pick-and-place assembly may travel to the centerline of each of the five storage rows of the ATH. A sensor flag 425 (not seen in FIG. 17) is fastened to housing 429 and optical sensors are attached to a horizontal framing member 485. Sensor 463 is mounted in a position such that when the sensor flag blocks this sensor, the pick-and-place assembly is aligned with the suction cup directly over storage row 233. Sensor 465 similarly serves for alignment at row 231. Sensor 467 serves row 229 and sensor 469 is for alignment at row 227. Another sensor 487 (not shown in FIG. 17) allows alignment at row 225.

Figure 18:
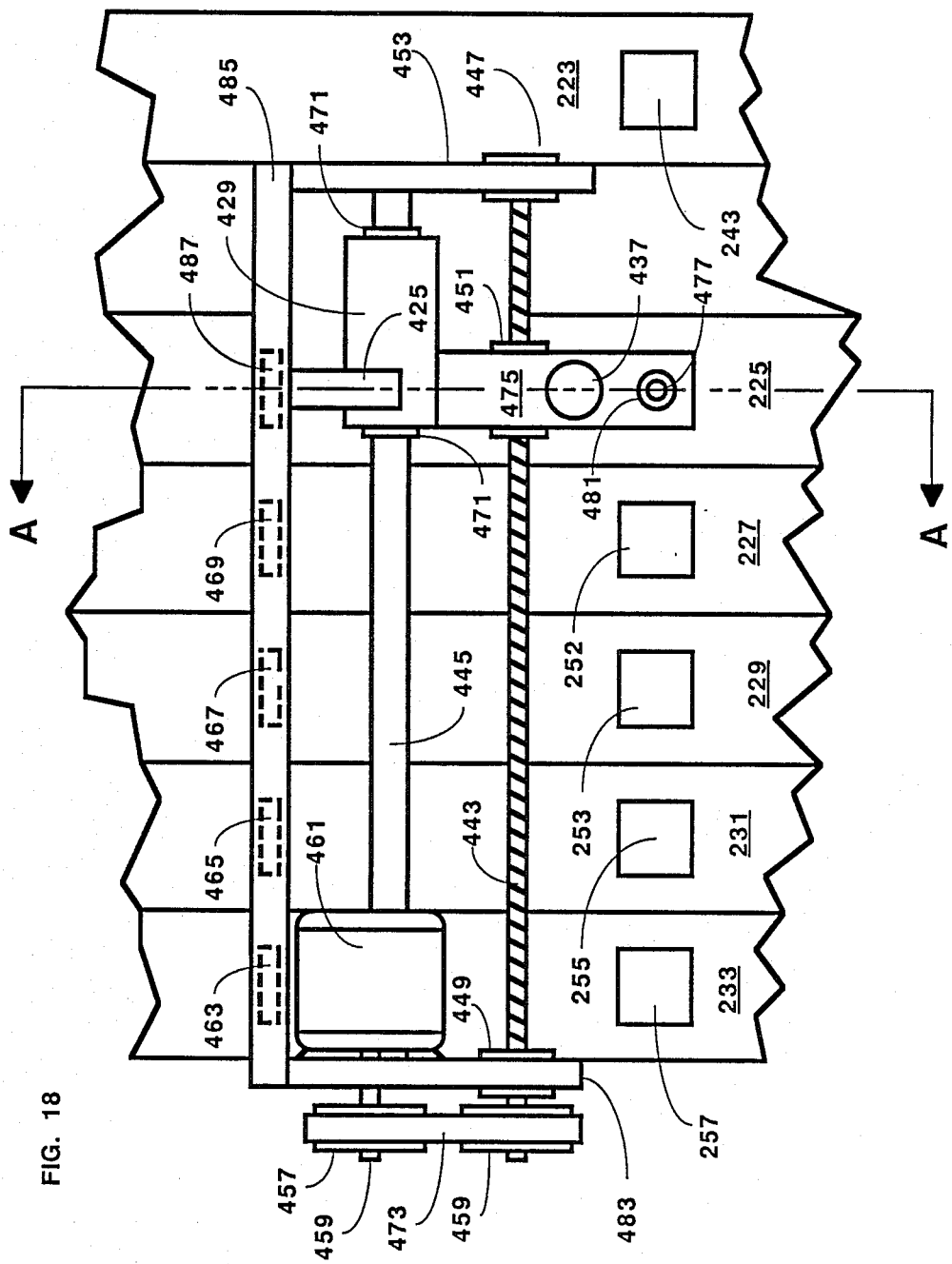
FIG. 18 is a plan view of the Five Zone Slide Assembly of FIG. 17.

FIG. 18 is a top view of the five zone slide module and illustrates most of the same elements shown by the elevation view, FIG. 17. Sensor flag 425 is shown in FIG. 18 as well as the position of sensor 487, neither of which are evident in FIG. 17. The relationship of the assembly to the transfer positions in each of the rows is evident in the plan view.

Figure 19:
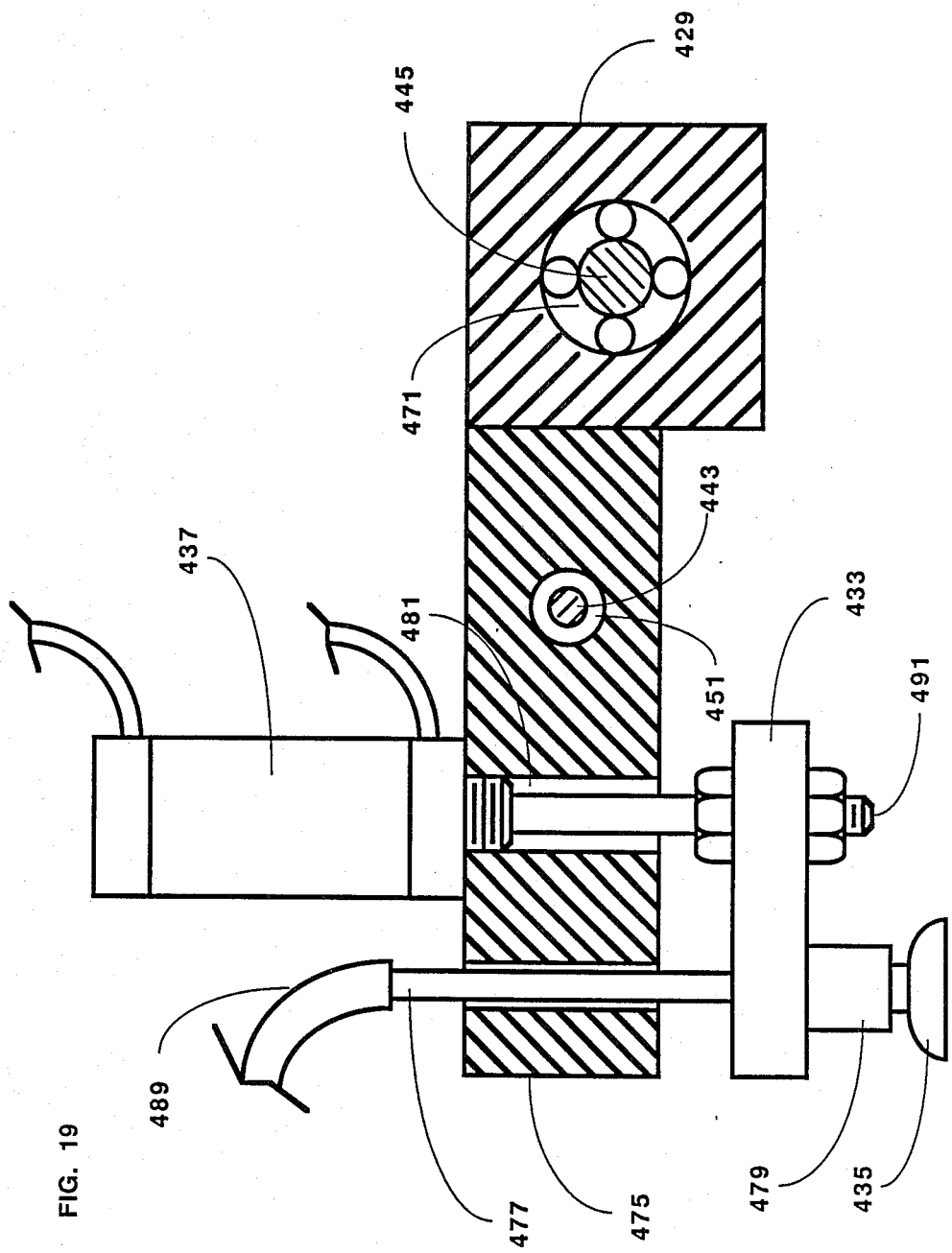
FIG. 19 is a close-up view, partly in section, of the pick-up apparatus of the Five Zone Slide Assembly.

FIG. 19 is a side view section through the pick-and-place assembly of the five zone slide module taken along section line A—A of FIG. 18, and shows how the pick-and-place assembly operates. Cylinder shaft 491 is seen in this view, and is shown attached to arm 433 by use of conventional nut fasteners, such that arm 433 travels vertically with the cylinder shaft, being restrained and guided by rigid tubing 477 through hole 481 in housing 475. Flexible tubing 489 which connects rigid vacuum tube 477 to the solenoid operated control valve (not shown) that provides vacuum and vent to suction cup 435 is also seen in FIG. 19. Control coordination between the solenoid operated valve that controls vaccuum and exhaust to the suction cup, the solenoid valve that controls the air cylinder to raise and lower the suction cup, and the electric motor that drives the lead screw, allows packages to be picked up in row 225 (at position 252 of FIG. 10), to be transferred laterally, and to be placed in any one of the other storage rows at position 257, 255, 252 or 444. For example, the control may be pre-programmed for all packages that pass the electrical tests to be stored in sticks in row 233. When a package from the test head is placed in row 227 at position 252, and the signal from the test head controller indicates that that package passed the electrical test, a control sequence is initiated to cause the package to go to row 233. First, the single position pick-and-place that transferred the package from the X-Y stage to position 252 is rotated back to the up position to be ready for the next transfer. This is required because two pick-and-place assemblies cannot serve a single point at the same time. When the appropriate optical sensor indicates the single position pick-and-place assembly is clear, motor 461 drives the pick-and-place assembly of the five row slide module to position 252, as indicated by sensor 469. Cylinder 437 is activated moving cup 435 down to contact the newly arrived package at position 252, the appropriate solenoid is shifted to connect vacuum to the suction cup, and the package is picked up by the suction cup. Now cylinder 437 is activated to retract its shaft and the cup, with the package attached, raises to an upper position above the storage rows. Motor 461 activated again drives lead screw 443 moving assembly 431 laterally across the storage rows until sensor 463 indicates arrival at row 233. Before arrival at row 233 the pinch roller drive for that row moves to position an empty pocket of a stick in that row to point 257. The motor stops, cylinder 437 is signalled again extending the cylinder shaft, and the package being transferred is placed in the empty pocket at position 257. The solenoid controlling vacuum to the suction cup is shifted to vent, and the package is released; then the pick-up assembly retracts to be ready to travel laterally to home position needed for transfer.

A sequence of events similar to the sequence illustrated for transferring to row 233 can be used to transfer packages into any one of rows 233, 231, 229 or 225. If a test result signal is such as to require that the package trnsferred stay in row 227, the lateral transfer is not made. Instead, the stick in row 227 is indexed by the pinch roller mechanism serving that row to bring the next empty pocket to position 252.

Empty sticks in storage rows travel in the direction shown by the appropriate arrows in FIG. 10 toward the front of the ATH. When all the pockets of a stick in a storage row are filled, that stick is driven out of the pinch roller and moved one position down the auger elevator serving that row at the "front" of the ATH, and a new empty stick is brought up the "back" elevator. The new stick is started into the pinch roller by the appropriate air cylinder shaft, and the pinch roller positions the first empty pocket of the stick at the transfer position. When any front storage elevator is full, and there are no empty sticks to bring to position to store additional poackages in a storage row, the optical sensor at the bottom of the front auger elevator signals the full condition to the digital controller of the ATH, and operation is shifted to a "pause" mode until an operator unloads some or all of the sticks containing stored, tested packages.

Automatic Stick Ejection

As operation of the preferred embodiment of the ATH proceeds, IC packages to be tested are picked from pockets at point 243 in load-unload row 223, but no packages are returned to row 223 after test. As all pockets of a particular stick are emptied, the empty stick is moved to the "back" elevator of the load unload row, and moved one position down the elevator. A new stick with packages to test is brought at the same time up the "front" load elevator and started by the loader air cylinder into the pinch roller. The new stick is positioned by the pinch roller and indexed one pocket at a time, providing new packages to test to the single station pick-and-place mechanism serving the load-unload row. Empty sticks reaching the lowermost position of the back elevator of the load-unload row are automatically ejected from the elevator (and from the ATH). FIGS. 20A and 20B show the arrangement of mechanisms that accomplishes the ejection of empty sticks. FIG. 20A is an elevation view of an auger elevator at the "back" position of load-unload row 223. FIG. 20B is a plan view showing only the lower level of the elevator. A triangular element 493 is mounted to the lower framing element such that, as an empty stick such as stick 495 is lowered in the elevator, the stick will contact inclined plane 497 and be urged in the direction of arrow 499. A twin belt conveyor assembly 501 is shown (partially in section in FIG. 20A). As stick 495 is pushed out of the elevator near the bottom, the end of the stick toward conveyor 501 will contact the belts of the conveyor. In the preferred embodiment, conveyor 501 runs continuously in the unload direction; but controls may be implemented in other embodiments to turn conveyor motor 503 on and off as required to unload sticks.

Once a stick contacts the belts of conveyor 501 it is pulled out of the augers of the elevator. In the preferred embodiment there is an opening in the bottom framework, and the empty sticks fall out the bottom of the ATH, where they may be collected in a plastic bin or other container. In other embodiments there may be connection to outside conveyances to move the empty sticks automatically to locations away from the immediate area of the ATH. In the preferred embodiment the direction of ejection is back toward the center of the ATH, ejection out the bottom taking place between the elevators of the dual elevator assembly of row 223; but in other embodiments ejection may be in the opposite direction, out the "back" of the ATH.

Overall Packaging and Operation

Figure 21:
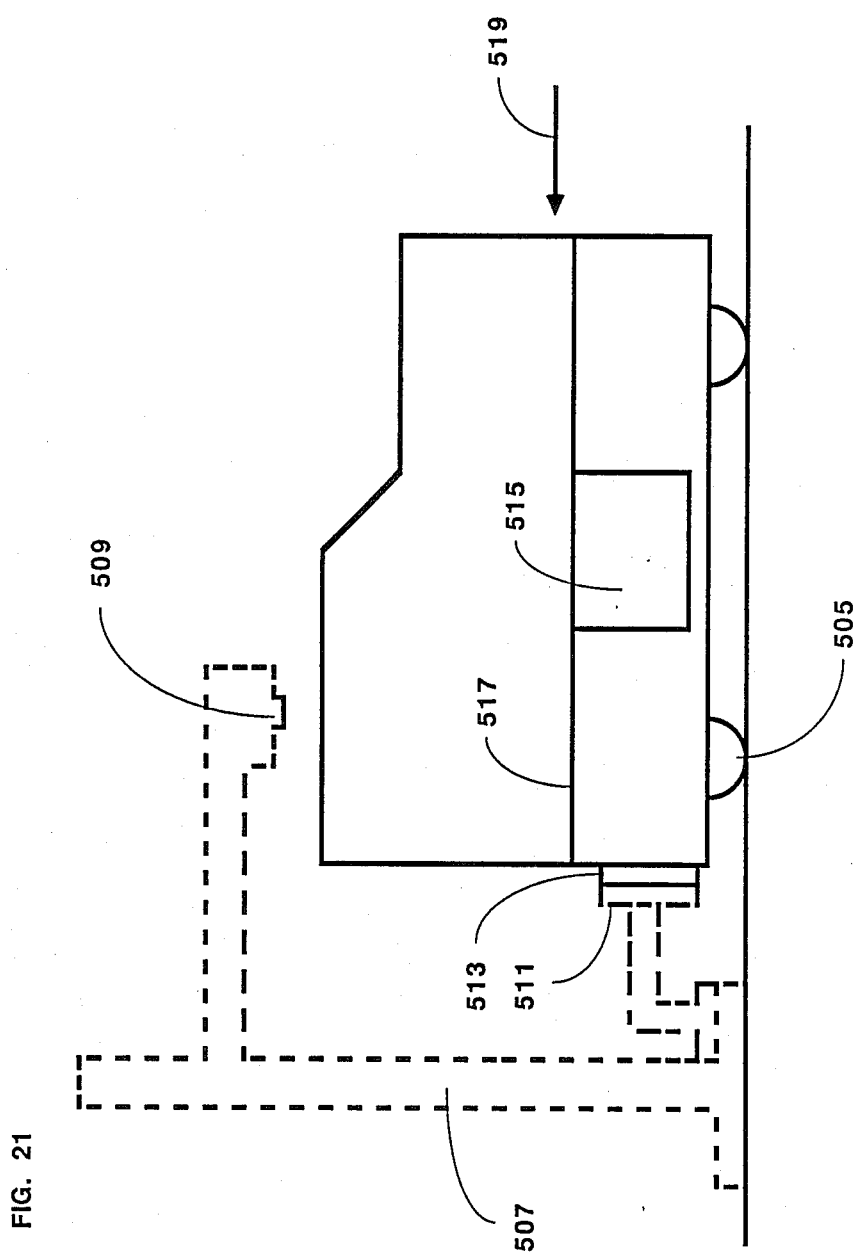
FIG. 21 is a side elevation view showing the relationship of the ATH to a test head assembly.

FIG. 21 is a side elevation view of the ATH of the preferred embodiment, seen from the side near the load-unload row. Structure 507 shown in phantom view represents a test head support structure which is separate from the ATH. The test head structure has test heads at approximately position 509, facing downward, and these are the heads to which the two-position presentation module of the ATH of the preferred embodiment presents IC packages to be tested, pins up. The test head structure preferably has a mounting pad at about position 511 to which a mount pad extension 513 of the frame of the ATH may be connected by conventional fasteners in such a manner that the positions of the two-position presentation module of the ATH and the test heads of the test head structure will be in alignment. The ATH of the preferred embodiment is on casters 505 so that it may be rolled away when not connected to the test head structure. There is a control umbilical (not shown) by which the controller of the test head structure and the controller of the ATH may communicate. It is through this umbilical that test results for particular IC packages are communicated to the ATH controller so that it may make decisions as to where the tested packages are to be stored in the ATH. There is an access panel at about position 515 for removing unloaded sticks that have been ejected from the ATH. Line 517 represents about the bottom level of the auger elevator rows of the ATH. Arrow 519 is about the position that new loaded sticks are inserted to the lowermost position of the front elevator of the load-unload row in the preferred embodiment.

Figure 22:
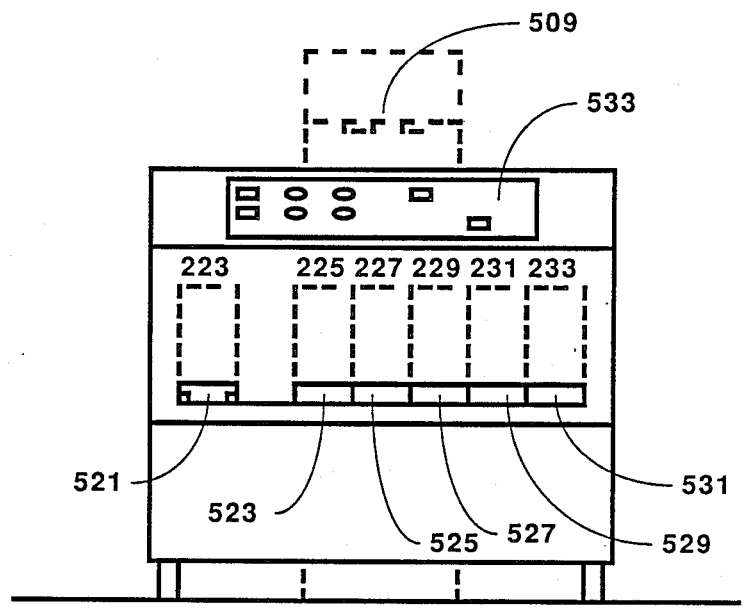
FIG. 22 is an end view of FIG. 21.

FIG. 22 is a front view of the ATH of FIG. 21 (in the direction of insertion arrow 519). Point 521 is where loaded sticks are inserted into the lowermost level of the load-side auger elevator of load-unload row 223. The approximate positions of the storage rows are marked across the top and the rows are shown in phantom view. Sticks filled with tested IC packages are removed from the storage rows at positions 523, 525, 527, 529 and 531 of rows 225, 227, 229, 231 and 233 respectively.

Digital Control System

Figure 23:
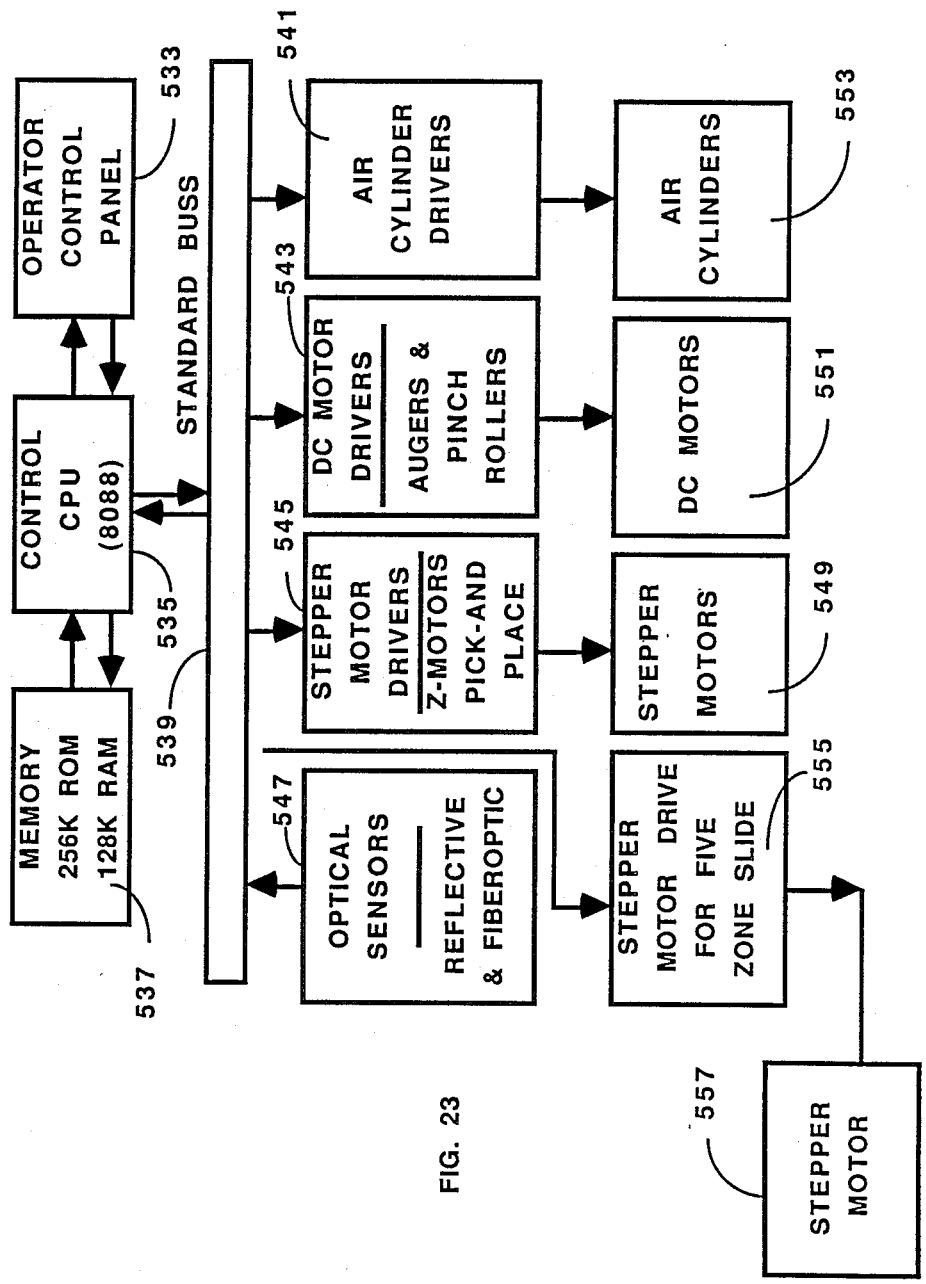
FIG. 23 is a block diagram showing the control architecture of the ATH.

The ATH of the preferred embodiment is controlled by a digital control system with an architecture illustrated by FIG. 23. The primary intelligence is resident in a CPU 535 based on an 8088 microprocessor chip. The CPU communicates as shown by the arrows with a memory unit 537 that has 256 K bytes of read-only memory (ROM) and 128 K bytes of random-access memory (RAM). The ROM is for retention of executive programs that are not to be accessed on a routine basis, such as basic handling sequences for the various mechanisms of the ATH; and the RAM is for accessible storage of data and program sequences that an end user may tailor to particular needs. As an example, the end user may wish to change the designation of storage rows relative to test results for tested packages, therefore the programming that directs the destination of the five zone slide module as a result of test results would be resident in the RAM.

CPU 535 also communicates with an operator control panel 533 which is attached to the frame of the ATH and has input and output devices for an operator's use to initiate various operating modes, access diagnostic information and to input specific limited programming sequences that are available to the end user. The control panel comprises a digital display device for displaying, for instance, error messages to an operator; an input means for an operator to perform limited programming and to store the steps in the RAM unit, as well as to actuate discrete operations for trouble-shooting and other purposes (manual operation); a "Power" pushbutton; an "Unload" pushbutton; a "Start" pushbutton; a "Load" light; a "Load" pushbutton; and a "Stop" pushbutton.

The CPU does input/output operations with machine elements by means of a standard communications buss 539. Signals are received from both reflective and fiber-optic optical sensors 547 that sense the position of movable and moving parts of the system, and these signals are sent to the CPU over the standard buss, where they are used in conjunction with the program to make decisions in the control sequences. Signals from the CPU are communicated via the buss to a stepper motor drive unit 555 for the five zone slide module, and this drive unit generates, in response, the voltages in the required wave forms to drive the stepper motor for the five zone slide module, including ramping up and ramping down. Signals are also carried by the buss from the CPU to stepper motor drivers 545 to drive stepper motors 549 that don't require ramping for z-direction drive motors and pick-and-place mechanisms. The buss also carries signals to DC motor drivers 543 to cause those drivers to generate the DC electrical signals to drive DC motors 551 to operate the augers for the various elevators and the pinch roller drives. In a like manner, signals are carried by the buss to air cylinder drivers 541 to cause air cylinders 553 to operate at the appropriate times in the operation of the ATH.

Figure 24:
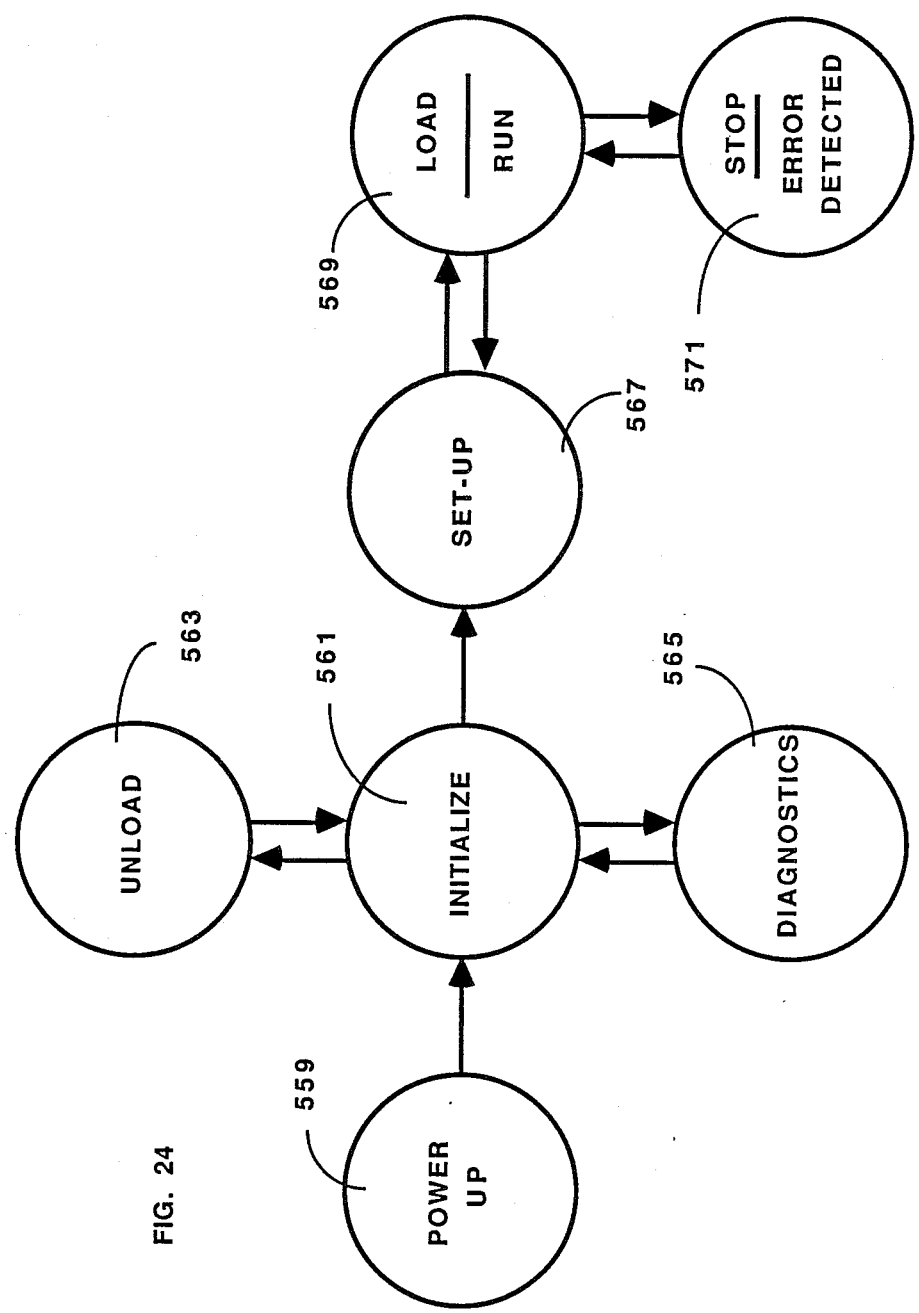
FIG. 24 is a control flow diagram of the operating modes of a digital controller of the ATH.

The operating modes of the ATH of the preferred embodiment are represented in the control flow diagram of FIG. 24. The first operating mode is Power Up 559, and this mode is accessed by an operator depressing the Power pushbutton, assuming that primary power to the ATH is connected. In the Power Up mode the control programming operates to stop all motors and then to perform a self test (RAM check, etc.) without moving the motors. After the self test, all the sensors are polled by the controller to detect the presence of sticks or devices-under-test (DUT) in the ATH. After the sensor check control passes to the Intialize mode 561, and if sticks or DUT were detected, the operator is prompted via the digital display device to initiate an Unload operation. In this eventuality the operator pushes the Unload pushbutton, and control passes to the Unload mode 563. The operator is prompted in the Unload mode to confirm and select either a partial or a complete unload operation, ie. unloading or keeping the empty sticks in the output rows and the sticks of untested packages in the input row, along with the partially filled output sticks. When the Unload operations are completed, control passes back to the Initialize Mode.

From the Initialize Mode the operator may, by entering a password, invoke a Diagnostic Mode 565. There are two sub-routines in the Diagnostic Mode, invoked by distinct passwords: one in which at least one stick and DUT are required, and the operator may run or repeat operations to verify performance; and another in which the operator may turn on and off individual motors and check individual sensors without using a stick or DUT. Also from the Initialize Mode the operator may enter the Set-Up Mode 567 and provide, through the input means, information needed by the controller such as lot number and lot size, row number to output lane assignment, or the number of consecutive DUT failures allowable before automatic halt and alarm.

Load Mode is programmed in conjunction with Run Mode 569, so that the need to load may be automatically sensed when the load row elevator into which sticks of devices to test are inserted is empty. When this situation is detected during a run or when the Start pushbutton is depressed, operations will stop and a Load Light will light, informing the operator that load is needed. When the operator pushes the Load Pushbutton in response to the Load light, a load door opens in the row designated for loading, and the operator may insert sticks with devices to be tested in the pockets of the stick. Load Mode will continue until a stick reaches the top of the load elevator, at which time operations will begin, or the operator may push the Start pushbutton to initiate Run operations and automatic testing.

There is a Stop Mode 571 which is accessed either manually by the operator pushing the Stop pushbutton, or automatically in response to an error detected by sensors on the ATH. The motors will stop operating at intended limits (home position), which is a programmed condition. Operations will resume with the depression of the Start pushbutton after a Stop mode. If the Stop Mode was accessed by the controller in response to a detected error condition that the controller is programmed to recognize, diagnostic messages may be displayed via the digital display means to the operator.

Only a few of the desirable embodiments of the invention have been illustrated in this specification, and it will be apparent to a person skilled in the art of automatic test handling that there are many alterations that may be made without departing substantially from the spirit and scope of the invention. For example, the elevators may be made any convenient height to change the number of sticks that may be stored in an elevator. Similarly, the width and length of a stick may be altered separately or together to accomodate IC packages of dimensions that may not be conveniently handled in the sticks of the preferred embodiment, and the auger elevators may be designed to transfer sticks with these new dimensions. There may be more rows than those of the preferred embodiment, or fewer, and there may be more than one row used for loading and unloading by changing the number of stations in the X-Y module and adding pick-and-place mechanisms as needed. In a similar manner, an ATH embodiment of the invention can be provided to present IC packages to be tested to only one test head, or to more than the two test heads of the preferred embodiment. Those skilled in the art will understand that there are many other changes that may be made without departing from the spirit and scope of the invention.

What is claimed is:

1. A handler for presenting circuit packages to a test head, said handler working in conjunction with a plurality of carrier platens, hereinafter called sticks, each stick adapted for holding a plurality of packages in a substantially horizontal linear array, the linear array defining a linear axis for the stick, comprising:
   input elevator means for receiving a first stick loaded with a first package, with the linear axis of said first stick oriented in a first direction, for moving said first stick vertically to an index level with said linear axis oriented in a direction parallel to said first direction;
   input drive means for moving said first stick horizontally in a direction parallel to said first direction at said index level to an index position where said first package can be removed from said first stick, and for moving said first stick away from said index position after said package has been removed;
   first pick-up means, for removing said first package from said first stick when said first stick is located at said index position and for moving said first package to a stage pick-up position;
   stage means for receiving said first package when said first pick-up means moves said first package to said stage pick-up position, for presenting said first package to the test head for testing thereby, and for moving said first package to a stage exit position after testing by the test head;
   stage pick-up means for removing said first package from said stage means when said first package is located at said stage exit position, and for placing said first package in a stage row stick at a stage row receiving level;
   third pick-up means for removing said first package from said stage row stick, and for placing said first package into a storage row stick located at a storage row receiving level in response to a signal from said test head.

2. A handler as in claim 1 wherein said third pick-up means includes translation means for placing said first package into one of a plurality of storage row sticks located at a storage row receiving level in response to a signal from said test head.

3. A handler as in claim 2 comprising a plurality of storage elevator means for holding the plurality of storage row sticks and for moving the plurality of storage row sticks to a vertical level different than said storage row receiving level for storage.

4. A handler as in claim 3 wherein said first stick comprises a periphery having two parallel sides spaced apart horizontally and oriented in a direction parallel to said linear axis, and wherein said input elevator means comprises at least four input elevator augers spaced apart to engage the periphery of said first stick with two of said augers on each of said parallel sides, said augers configured for moving said first stick vertically to said index level as said augers are turned.

5. A handler as in claim 4 wherein said input elevator means comprises input elevator drive means for turning said augers.

6. A handler as in claim 5 wherein said input elevator means comprises four input elevator exit augers spaced apart to engage the periphery of said first stick with two of said input elevator exit augers on each of said parallel sides, said input elevator exit augers configured for moving said first stick vertically to a level different than said index level as said augers are turned after said first package has been picked up from said first stick.

7. A handler as in claim 5 further comprising a stage row exit elevator means for moving said stage row stick to a level different than said stage row receiving level.

8. A handler as in claim 7 further comprising a stage row input elevator means for moving said stage row stick from a level different than said stage row receiving level to said stage row receiving level.

9. A handler as in claim 1 wherein said input elevator means comprises first detector means for sensing when the first stick is located at said index position.

10. A handler as in claim 2 wherein said stage row stick is included in said plurality of storage row sticks.

11. A handler for presenting circuit packages to a test head, said handler working in conjunction with a plurality of carrier platens, hereinafter called sticks, each stick adapted for holding a plurality of said packages in a substantially horizontal linear array, the linear array defining a linear axis for the stick, comprising:

input elevator means for receiving a plurality of sticks, each stick loaded with a plurality of packages, with the linear axis of each of said sticks in said input elevator means oriented in a first direction, for moving each of said sticks vertically to an index level with said linear axis of each stick oriented in a direction parallel to said first direction;

input drive means for moving each of said plurality of sticks horizontally in a direction parallel to said first direction at said index level to an index position where each of said packages can be removed from said sticks, and for moving each of said sticks away from said index position after each of said packages has been removed from its respective stick;

first pick-up means for removing said packages from said plurality of sticks when each of said sticks is located at said index position and for moving said packages to a stage pick-up position;

stage means for receiving each of said packages when said first pick-up means moves each of said packages to said stage pick-up position, for presenting said packages to the test head for testing thereby, and for moving said packages to a stage exit position after testing by the test head;

stage pick-up means for removing said packages from said stage means when said packages are located at said stage exit position, and for placing said packages in a stage row stick at a stage row receiving level;

third pick-up means for removing said packages from said stage row stick, and for placing said packages into a storage row stick located at a storage row receiving level in response to a signal from said test head.

12. A handler for presenting circuit packages to a test head comprising:

a plurality of carrier platens, hereinafter called sticks, each stick adapted for holding a plurality of said packages in a substantially horizontal linear array, the linear array defining a linear axis for the stick;

input elevator means for receiving a plurality of sticks, each stick loaded with a plurality of packages, with the linear axis of each of said sticks in said input elevator means oriented in a first direction, for moving each of said sticks vertically to an index level with said linear axis of each stick oriented in a direction parallel to said first direction;

input drive means for moving each of said plurality of sticks horizontally in a direction parallel to said first direction at said index level to a plurality of index positions, each index position being where one of each of said packages can be removed from said sticks, and for moving each of said sticks away from said index positions after all of said packages have been removed from a stick;

first pick-up means for removing said packages from said plurality of sticks when each of said sticks is located at said index position and for moving said packages to a stage pick-up position;

stage means for receiving each of said packages when said first pick-up means moves each of said packages to said stage pick-up position, for presenting said packages to the test head for testing thereby, and for moving said packages to a stage exit position after testing by the test head;

stage pick-up means for removing said packages from said stage means when said packages are located at said stage exit position, and for placing said packages in a stage row stick at a stage row receiving level;

third pick-up means for removing said packages from said stage row stick, and for placing said packages into a storage row stick located at a storage row receiving level in response to a signal from said test head.

13. A handler as in claim 12 wherein each of said sticks comprise a plurality of nacelle means, each nacelle means for cradling one of said packages in a manner to substantially eliminate motion of said one of said packages relative to said stick during transport in said handler.

14. A handler as in claim 13 wherein said nacelle means are arranged in a single linear array in each of said sticks.

15. A handler as in claim 14 wherein each stick comprises indexing means for providing feedback to said drive means when said stick is located at an index position.

16. A handler as in claim 15 wherein said indexing means comprises a sequence of holes correlated with positions of said nacelles.

17. A handler as in claim 16 further comprising sensing means for sensing the presence of at least one of said holes when one of said sticks is located at one of said index positions.

18. A handler as in claim 15 wherein each of said sticks comprises two parallel sides each of which is parallel to said single linear array.

* * * * *